United States Patent
Chaji et al.

(10) Patent No.: US 12,464,875 B2
(45) Date of Patent: Nov. 4, 2025

(54) HIGHLY EFFICIENT MICRODEVICES

(71) Applicant: VueReal Inc., Waterloo (CA)

(72) Inventors: Gholamreza Chaji, Waterloo (CA); Ehsanollah Fathi, Waterloo (CA); Yunhan Li, Kitchener (CA); Hossein Zamani Siboni, Waterloo (CA)

(73) Assignee: VueReal Inc., Waterloo (CA)

( * ) Notice: Subject to any disclaimer, the term of this patent is extended or adjusted under 35 U.S.C. 154(b) by 0 days.

(21) Appl. No.: 18/047,903

(22) Filed: Oct. 19, 2022

(65) Prior Publication Data
US 2023/0055752 A1      Feb. 23, 2023

Related U.S. Application Data

(62) Division of application No. 16/535,866, filed on Aug. 8, 2019.

(60) Provisional application No. 62/793,017, filed on Jan. 16, 2019, provisional application No. 62/733,434, filed on Sep. 19, 2018.

(51) Int. Cl.
*H10H 20/857*     (2025.01)
*H10H 20/01*      (2025.01)
*H10H 20/831*     (2025.01)

(52) U.S. Cl.
CPC ...... *H10H 20/857* (2025.01); *H10H 20/0137* (2025.01); *H10H 20/8314* (2025.01)

(58) Field of Classification Search
CPC .............. C09K 11/08; H01L 29/66666; H01L 29/7827
See application file for complete search history.

(56) References Cited

U.S. PATENT DOCUMENTS

| | | | |
|---|---|---|---|
| 8,080,468 B2 * | 12/2011 | Scherer | B82Y 40/00 438/479 |
| 8,476,637 B2 | 7/2013 | Kim et al. | |
| 8,664,636 B2 | 3/2014 | Konsek et al. | |
| 8,946,675 B2 | 2/2015 | Yu et al. | |
| 9,362,448 B2 | 6/2016 | Choi et al. | |
| 9,385,266 B2 | 7/2016 | Cha | |
| 9,490,395 B2 | 11/2016 | Hwang et al. | |
| 10,283,565 B1 | 5/2019 | Xu | |
| 10,388,224 B2 | 8/2019 | Kim | |
| 10,431,717 B1 | 10/2019 | Dasgupta | |

(Continued)

FOREIGN PATENT DOCUMENTS

| | | |
|---|---|---|
| CN | 102185043 A | 9/2011 |
| CN | 103943733 A | 7/2014 |

(Continued)

OTHER PUBLICATIONS

Ding et al., "Guided mode caused by silicon nanopillar array for light emission enhancement in color-converting LED," Opt. Express 23, pp. 21477-21489 (2015).

(Continued)

*Primary Examiner* — Evren Seven
(74) *Attorney, Agent, or Firm* — Nixon Peabody LLP

(57) ABSTRACT

Methods and structures are disclosed for highly efficient vertical devices. The vertical device comprising a plurality of planar active layers formed on a substrate, at least one of a top layer of the plurality of the layers is formed as a plurality of nano-pillars and a passivation layer formed on a space between the plurality of the nanopillars.

9 Claims, 25 Drawing Sheets

(56) References Cited

U.S. PATENT DOCUMENTS

| | | | |
|---|---|---|---|
| 10,811,528 B2 | 10/2020 | Ebrish | |
| 2003/0111447 A1* | 6/2003 | Corkum | B23K 26/0624 |
| | | | 219/121.76 |
| 2003/0235970 A1 | 12/2003 | Hsu et al. | |
| 2004/0113155 A1 | 6/2004 | Lai | |
| 2004/0144985 A1 | 7/2004 | Zhang et al. | |
| 2007/0077670 A1* | 4/2007 | Kim | H01L 33/08 |
| | | | 257/E33.033 |
| 2007/0126013 A1* | 6/2007 | Kim | H01L 33/0095 |
| | | | 257/E33.068 |
| 2008/0128727 A1 | 6/2008 | Erchak et al. | |
| 2008/0142782 A1 | 6/2008 | Moon et al. | |
| 2013/0341589 A1 | 12/2013 | Yu et al. | |
| 2014/0173448 A1 | 6/2014 | Aly | |
| 2014/0353593 A1 | 12/2014 | Smets | |
| 2015/0053929 A1 | 2/2015 | Lee et al. | |
| 2017/0005207 A1 | 1/2017 | Li | |
| 2017/0352776 A1 | 12/2017 | Shur | |
| 2018/0204977 A1 | 7/2018 | Dheeraj | |
| 2018/0237649 A1 | 8/2018 | Pan | |
| 2018/0269355 A1 | 9/2018 | Jain | |
| 2018/0351035 A1 | 12/2018 | Chung | |
| 2019/0006413 A1* | 1/2019 | Jacob | H10D 62/8503 |
| 2019/0123238 A1 | 4/2019 | Moosburger | |
| 2019/0355868 A1 | 11/2019 | Fimland | |
| 2019/0363234 A1 | 11/2019 | Varghese | |
| 2020/0028027 A1 | 1/2020 | Daudin | |
| 2020/0135982 A1 | 4/2020 | Choi | |
| 2020/0152833 A1 | 5/2020 | Kaseya | |
| 2020/0161504 A1 | 5/2020 | Fimland | |
| 2020/0251629 A1 | 8/2020 | Kaseya | |
| 2020/0274029 A1 | 8/2020 | Schneider, Jr. | |
| 2020/0279974 A1 | 9/2020 | Noda | |

FOREIGN PATENT DOCUMENTS

| | | |
|---|---|---|
| CN | 106067461 A1 | 11/2016 |
| CN | 108461593 A | 8/2018 |
| KR | 20110133137 A | 12/2011 |
| TW | 201712891 A | 4/2017 |

OTHER PUBLICATIONS

Son et al., "Low voltage operation of GaN vertical nanowire MOSFET," Solid-State Electronics 145: 1-7 (2018).

Zhi et al., "Fabrication and Luminescent Property of GaN Based Light-emitting Diodes with Array Nanorods Structure," Chinese Journal of Luminescence, 2016,37(12): 1538-1544 DOI: 10.3788/fgxb20163712.1538 (with English Abstract).

\* cited by examiner

HIGHLY EFFICIENT MICRODEVICES

CROSS-REFERENCE TO RELATED APPLICATION(S)

This application claims priority from U.S. Provisional Patent Application No. 62/733,434 filed on Sep. 19, 2018 and 62/793,017 filed on Jan. 16, 2019, which are incorporated herein by reference in their entirety.

FIELD OF THE INVENTION

The present disclosure relates to the development of high performance microdevices, and more particularly, to nano-pillar hybrid microdevices with improved light emitting efficiency.

BACKGROUND OF THE INVENTION

Light emitting diodes (LEDs) and LED arrays can be categorized as vertical solid-state device. The microdevices may be sensors, light emitting diodes (LEDs) or any other solid devices grown, deposited, or monolithically fabricated on a substrate. In conventional approaches to fabricate microdevices, the main challenges are the native defects in the epitaxial layers and sidewalls that result in inefficient microdevices. Thus, there is a need for improved fabrication techniques that mitigates these defects and improves light emitting efficiency.

SUMMARY

The present disclosure provides nano-pillars hybrid microdevices to minimize defects in epitaxial layers and sidewalls.

The present disclosure provides highly efficient microdevices that mitigate the defects and improve light emitting efficiency.

According to one embodiment of the present disclosure, a vertical device is provided. The vertical device comprising a plurality of planar active layers formed on a substrate, at least one of a top layer of the plurality of the layers is formed as a plurality of nano-pillars, and a first passivation layer formed on a space between the plurality of the nano-pillars and at least a part of sidewalls of the plurality of nano-pillars;

According to another embodiment of the present disclosure, a method of fabricating a vertical device may be provided. The method comprising providing a plurality of planar active layers on a substrate, forming a plurality of nano-pillars on at least one of a top layer of the plurality of layers, and forming a first passivation layer on a space between the plurality of the nano-pillars and at least a part of sidewalls of the plurality of nano-pillars.

According to one embodiment, a vertical device may be provided. The vertical device comprising a plurality of planar active layers formed on a substrate, a thin doped layer formed on one of: a top or a bottom surface of the plurality of active layers, a passivation layer formed to cover at least a part of the thin doped layer, and a conductive layer coupled to the planar active layers through the areas not covered by the passivation layer.

Some embodiments of the present disclosure highlight some structures with larger pillars. In some cases, the structures can be modified specifically to fit better with the larger pillars.

Some embodiments highlight the process steps after lift-off process that can be applied to both nanopillars and larger pillars.

BRIEF DESCRIPTION OF THE DRAWINGS

The foregoing and additional aspects and embodiments of the present disclosure will be apparent to those of ordinary skill in the art in view of the detailed description of various embodiments and/or aspects, which are made with reference to the drawings, a brief description of which is provided next.

FIG. 5A-2 is a schematic cross-sectional diagram illustrating more than one area for contact for the microdevice, in accordance with an embodiment of the invention.

FIG. 5A-3 is a schematic cross-sectional diagram illustrating an ohmic contact as part of the electrode, in accordance with an embodiment of the invention.

FIG. 5A-4 is a schematic cross-sectional diagram illustrating the electrode is coupled with the ohmic contact, in accordance with an embodiment of the invention.

FIG. 5A-5 is a schematic cross-sectional diagram illustrating where the electrode is coupled with the ohmic contact, in accordance with an embodiment of the invention.

Use of the same reference numbers in different figures indicate similar or identical elements.

Figure 1A:
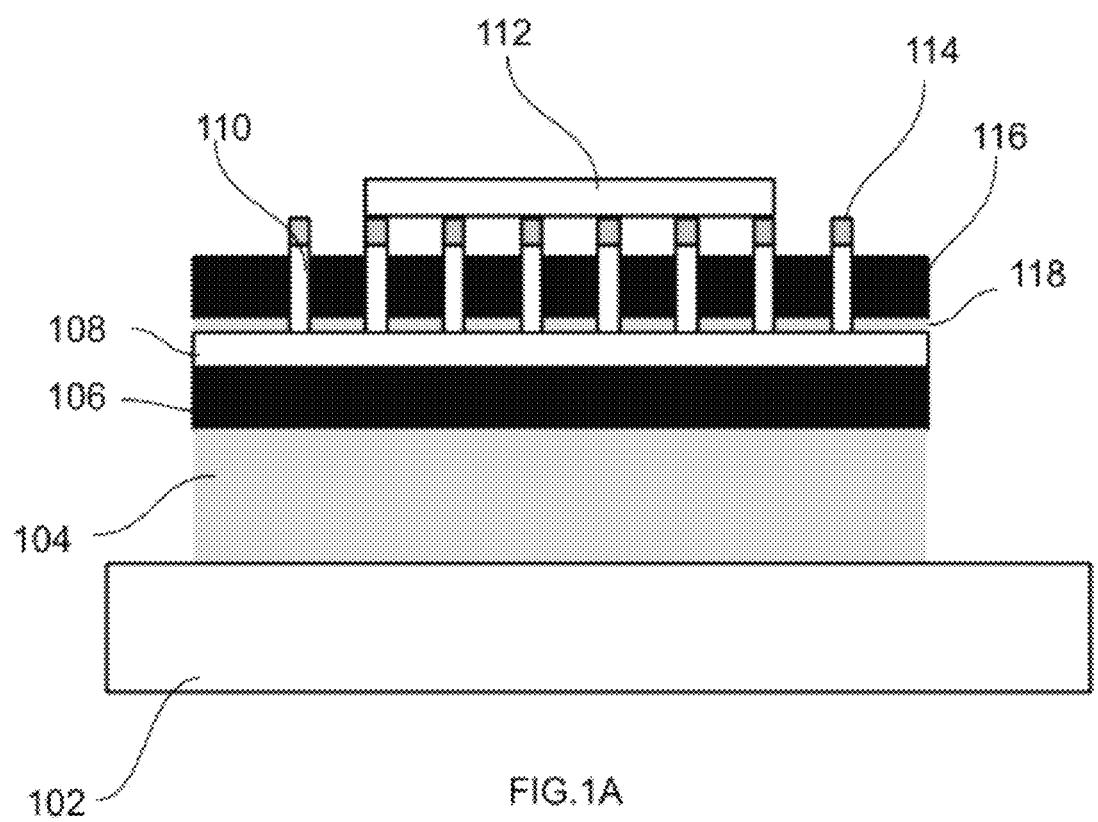
FIG. 1A is a schematic cross-sectional diagram illustrating a vertical device with a plurality of planar active layers including nanopillar structures on top of one of the active layers, in accordance with an embodiment of the invention.

The present disclosure is susceptible to various modifications and alternative forms, specific embodiments or implementations as have been shown by way of example in the drawings and will be described in detail herein. It should be understood, however, that the disclosure is not intended to be limited to the particular forms disclosed. Rather, this disclosure covers all modifications, equivalents, and alternatives falling within the spirit and scope of the invention as defined by the appended claims.

DETAILED DESCRIPTION

Unless defined otherwise, all technical and scientific terms used herein have the same meaning as commonly understood by one of ordinary skill in the art to which this invention belongs.

As used in the specification and claims, the singular forms "a", "an" and "the" include plural references unless the context clearly dictates otherwise.

In this disclosure, the terms 'nanostructures', 'nanopillars', and 'nanowires' are used interchangeably. 'Nanostructures', 'nanopillars', and 'nanowires' may be defined as structures that have a thickness or diameter constrained to tens of nanometers or less and an unconstrained length.

In this disclosure, the terms 'device', 'vertical device' and 'microdevice' are used interchangeably.

Light Emitting Diodes (LED) and LED arrays can be categorized as vertical solid-state device. The microdevices may be sensors, LEDs, or any other solid devices grown, deposited, or monolithically fabricated on a substrate. The substrate may be the native substrate of the device layers or a receiver substrate where device layers or solid-state devices are transferred to.

In conventional approaches of microdevice fabrication, the main challenge is the native defects in the epitaxial layers and sidewalls that results in inefficient microdevices. Thus, there is a need for improved fabrication techniques that mitigates these defects and improves light emitting efficiency.

The present disclosure relates to methods and structures for highly efficient microdevices. More specifically, the present disclosure relates to nanopillar hybrid microdevices that minimize defects in epitaxial layers and sidewalls and improve light emitting efficiency.

In one embodiment, a plurality of nano-pillars are formed on a top conductive layer of a substrate. A space between the nanopillars may be passivated using different film layers such as a dielectric layer. In one case, a passivation layer is formed between the nanopillars.

In another embodiment, a surface (i.e., the space between the nanopillars and nanopillar sidewalls) can be treated using chemical etching or plasma etching to mitigate defects.

In one embodiment, after the surface treatment, the surface between the nanopillars, the sidewalls of the nanopillars, or the exposed defects can be passivated using different film layers such as a dielectric layer. In one case, a passivation layer is formed on the sidewalls of the nanopillars.

In another embodiment, the nanopillars are at least partially deactivated. In one case, the nanopillar on top of the defect is eliminated. An etching and sonication or combination of both processes can be used to remove the nanopillar on top of the defects. In another case, the formation of nanopillars is controlled with a defect map so that no nanopillar is formed on top of a defect. Here, the surface of the planar layers is investigated to map the defects. The defect map is then used to control the formation of nanopillars on defective areas by adjusting the position of the nanopillars.

In one case, a patterned blocking layer and/or a patterned seed layer can be used to create the nanopillars.

In another embodiment, a gate electrode can be used to bias the nanopillars to control the charge accumulated on the surface of the nanopillar and/or control the current passing through the nanopillars.

In one embodiment, a metal-insulator-semiconductor (MIS) structure can be formed around the nano-pillars to further confine the current. Biasing the MIS structure can prevent or enhance the current spreading from the nanopillar area to the adjacent area.

In another embodiment, an MIS structure around the nanopillars can act as a current control. Here, biasing the MIS structure can control the amount of current going through the nanopillar to the device. This offers more controllability for the microdevice current biasing in addition to the voltage across the microdevice.

In one embodiment, the size and density of the nanopillar can be adjusted based on the operation range of the microdevice and the peak efficiency of the microdevice.

In one embodiment, the conductive/doped layer is thinned for some areas outside the device electrode for larger microdevices.

In another embodiment, there can be more than one area for the contact for the micro device other than ohmic contact. For larger microdevice, the extra contact can improve the current density and provide for redundancy to improve the yield.

Some embodiments highlight the process steps after lift-off process that can be applied to nanopillars or larger pillars.

Nanopillar Hybrid Microdevices Minimizing Defects in Epitaxial Layers and Sidewalls FIG. 1A shows a device substrate 102 where different conductive layers 104 and a plurality of planar active layers 106 are deposited on top of the device substrate 102, followed by other conductive/doped layers 108. The conductive layers 104 may comprise buffer layers, p-type doped layers, n-type doped layers, charge blocking layers, and an electrode. The active layers 106 comprise a multiple quantum well (MQW) layer, and other conductive layers 108. The MQW layer includes a plurality of single quantum layers in a stack. The conductive layers can be transparent or opaque. The examples of a transparent conductive layer are thin Ni/Au or ITO formed on the p-doped semiconductor layer (e.g., GaN or GaAs) for a better lateral current conduction. The conductive layer can have a stack of different layers. For example, the p-type electrode such as Pd/Au, Pt or Ni/Au is then formed on the transparent conductive layer.

After the vertical device layers are developed and placed properly for processing, one of the top conductive layers (e.g., the n- or p-doped layer) is formed as nanopillars 110. The nanopillars 110 are developed through either deposition, patterning, or different methods such as nanoimprint. The top layer is a monolithic layer consisting of pillar structures.

In one approach, an ohmic contact layer is formed on a top surface of the nanopillars to create nanocontacts 114 to cover at least a part of nanopillars 110. In one case, the ohmic contact layers or part of the ohmic contact layers are formed through lithography, stamping, lift-off or other methods to cover the at least one nanopillar. In another case, a very thin layer of the ohmic contact layer is formed and annealed. The annealing process can be a thermal process, optical process, or a combination of both. The annealing can occur in an ambient condition, vacuum, or different gases. In one case, this layer can be ITO, gold, silver, ZnO, Ni, or other materials, and may be formed through different means such as e-beam, thermal, or sputtering.

After forming the nanopillars 110 on the vertical device, an electrode 112 can be formed to define the contact area of the microdevice and also to connect the microdevices to other devices or circuitries. One method to form the electrode 112 is to deposit and pattern the layer. In another method, the electrode or a conductive pad is formed on a separate substrate that includes other components such as circuits, and then the electrode or pad is bonded to the surface of the nanopillar 110. In a different embodiment, a combination of deposition and bonding methods can be used. The bonding can be thermal compression, thermal/optical curing adhesive, eutectic, and so on. In one case, the ohmic layer may contain different materials. In this case, part of the ohmic layer is formed as a layer and the other part is part of the nanocontacts. For example, for GaN LEDs, the p ohmic contact is made of Ni and Au. In one case, the ohmic contact layer can contain both Ni and Au. In another case, the layer has only Ni, and the nanocontacts have an Au layer at the interface. After bonding, the pressure and heat applied to the samples assists in diffusing the separate layers and creating an improved ohmic contact.

In another embodiment, conic and needle-like nanostructures, pillars, and nanowires (NWs) made from transparent conductive oxides (TCO), metals, and/or conductive graphene-based materials such as reduced graphene oxide (rGO) and carbon nanotubes (CNTs) are used. These upright (or slightly tilted) structures provide a vertical current path with low resistivity and show mechanical flexibility and thermal stability advantages. The nanopillars can be randomly formed in high density arrangements or fabricated in ordered array structures with a desired size and pitch. The number of nanopillars may be optimized for maximum vertical conduction.

In yet another embodiment, the nanopillars are formed by etching a planar layer. A thin film layer is formed through different methods (e.g., plasma enhanced chemical vapor deposition (PECVD), sputtering, printing, or spin coating) to use as a hard mask and then a pattern is formed on top of the layer. The layer is etched using different methods (e.g., ion milling, dry etching, or wet etching) to form a 3D nanostructure. The structure may be formed either by etching the entire layer or only partially etching the planar layer.

In another method, the nanopillars are self-assembled on the surface. The surface of the vertical device area on either the microdevice or receiver substrate is treated either through deposition or a different curing process (e.g., surface functionalization) to enable selective assembly of the nanopillars on the vertical device areas or the entire surface area.

In another embodiment, the surface of the nanopillars is covered by the ohmic contact layer to enhance the bonding or electrical coupling process. In one case, the nanopillars are covered by materials that can be either cured through light, thermal, mechanical force, or chemical reaction. In this case, after aligning and connecting the receiver substrate and microdevices together, the required curing agent is applied to enhance the bonding.

In one embodiment, a space between the nanopillars 110 may be passivated using different film layers such as a dielectric layer 118. In one case, a passivation layer 118 is formed between the nanopillars 110. A variety of dielectric layers can be used which include but are not limited to $Si_3N_4$ and oxides such as $SiO_2$, $HfO_2$, $Al_2O_3$, $SrTiO_3$, Al-doped $TiO_2$, $LaLuO_3$, $SrRuO_3$, HfAlO, and $HfTiO_x$. The thickness of the dielectric layer may be a few nanometers or micrometers. A variety of methods such as ALD, CVD, PVD, or e-beam deposition are used to deposit the dielectric layer. In an embodiment, a high-K oxide dielectric layer is formed using the atomic layer deposition (ALD) method. The ALD method allows a very thin and high-K dielectric layer to be formed on the wafer. In another case, the dielectric can be a solution that is spinned, printed, or sprayed on the surface. Curing can be used after the solution deposition on the surface to harden the material. In another case, high bandgap material is used to passivate to create band bending at the interface of the defects and the passivation layer. The band bending can push the charges away from the interface.

In another embodiment, the space between the nanopillars is filled with a different filler layer 116. The filler layer 116 can be different materials such as polyamide, thermally/optically annealed adhesives, polymers, sol gel, or dielectric layers. The filler layer can be the same or a different layer from the passivation layer.

In another embodiment, the filler can be color conversion materials (e.g., quantum dots, or phosphor). This layer converts high wavelength signal to at least one lower wavelength signal.

Figure 1B:
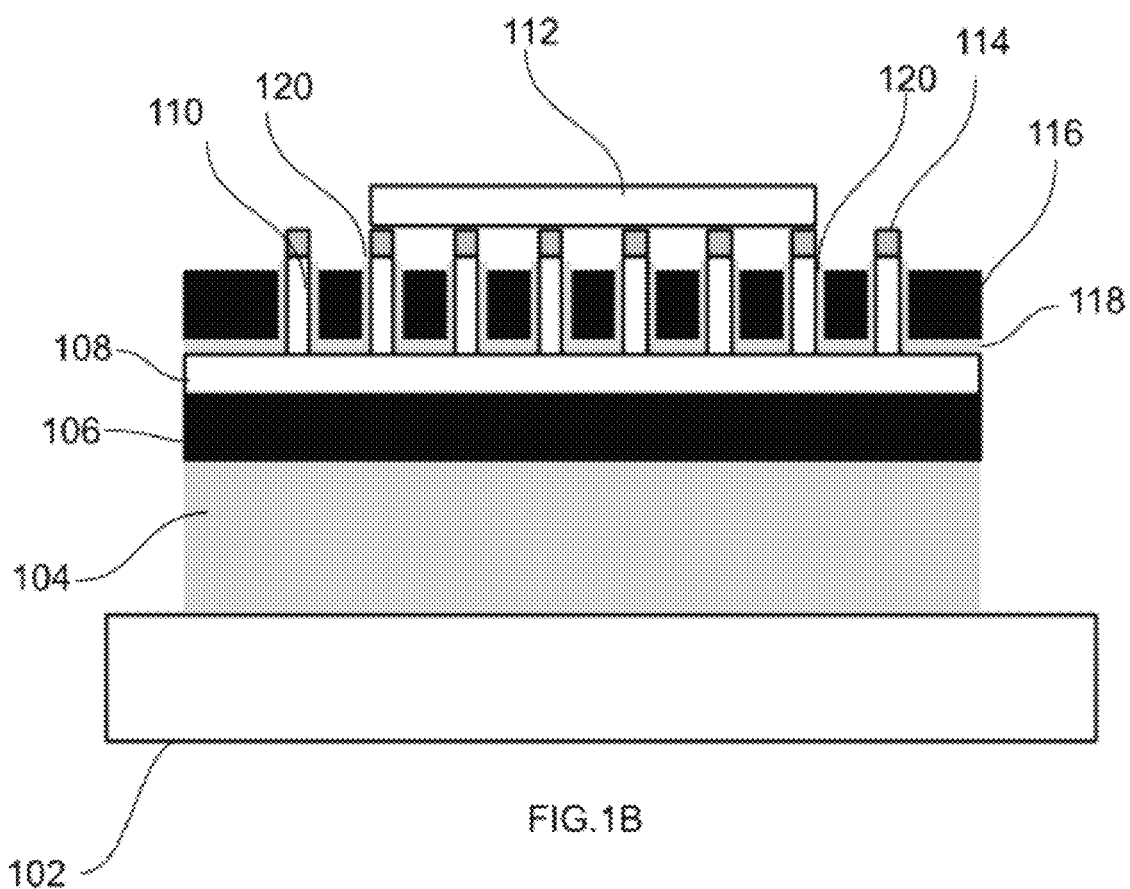
FIG. 1B is a schematic cross-sectional diagram illustrating the passivation of nanopillar sidewalls, in accordance with an embodiment of the invention.

FIG. 1B shows an embodiment highlighting the passivation of nanopillar sidewalls 120. This structure is similar to the structure discussed in FIG. 1A. However, in addition to the space between nanopillars, the sidewalls of the nanopillars are passivated as well. The sidewalls 120 may be passivated using different film layers such as a dielectric layer 118. In one case, a passivation layer 118 is formed on the sidewalls of the nanopillars 110. The passivation layer 118 includes a dielectric material, such as silicon oxide, silicon nitride, silicon oxynitride, silicon carbide, or another suitable dielectric material.

Figure 1C:
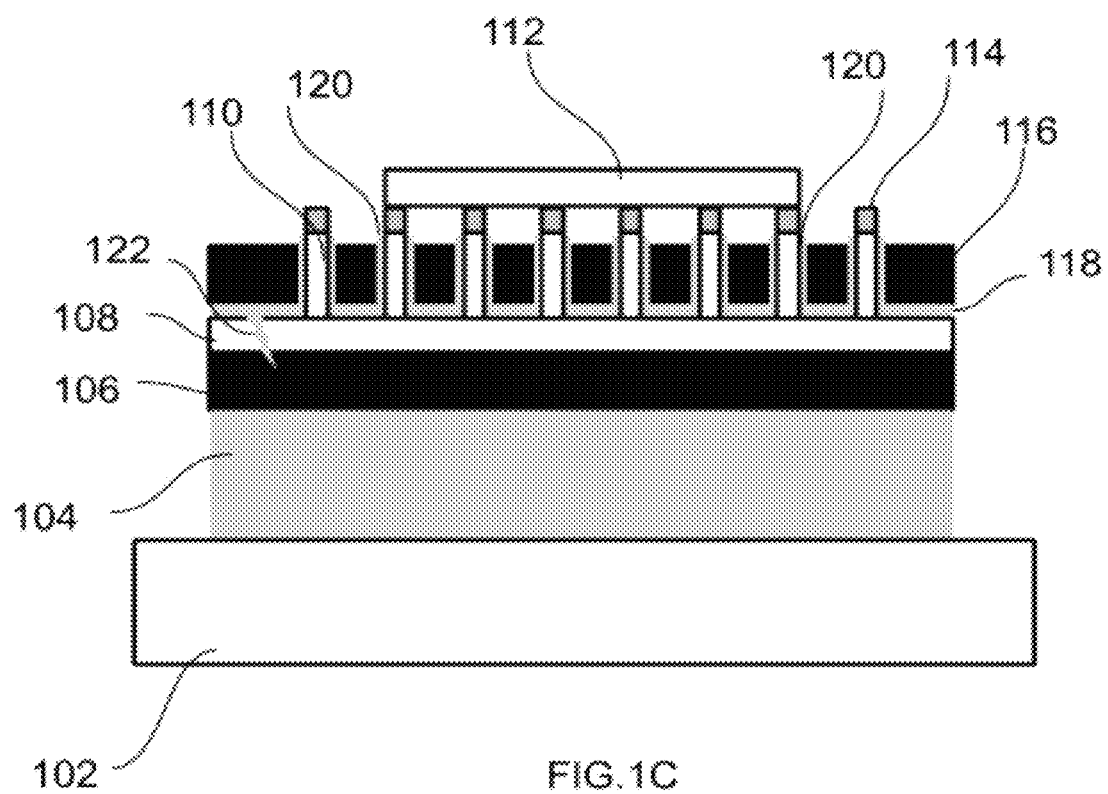
FIG. 1C is a schematic cross-sectional diagram illustrating a surface treatment process to the passivation layer, in accordance with an embodiment of the invention.

FIG. 1C shows an embodiment highlighting a surface treatment process provided to a passivation layer to expose defective areas underneath the nano-pillars, in accordance with an embodiment of the invention.

One method of the surface treatment process is etching. Etching the space between the nanopillars and sidewalls of the nanopillars can expose some of the non-idealities (e.g., defects, dislocations, or particles). In addition, the surface treatment can remove some of the unwanted particles or materials. After nanopillars 110 are formed, the surface (i.e., the space between the nanopillars and nanopillar sidewalls) can be treated using chemical or plasma etching. In one example, etching is performed using various etchants such as KOH or HCL for the surface treatment.

In some embodiments, a surface treatment process can be provided to expose defective areas underneath the nanopillars before the passivation layer is formed.

Figure 2A:
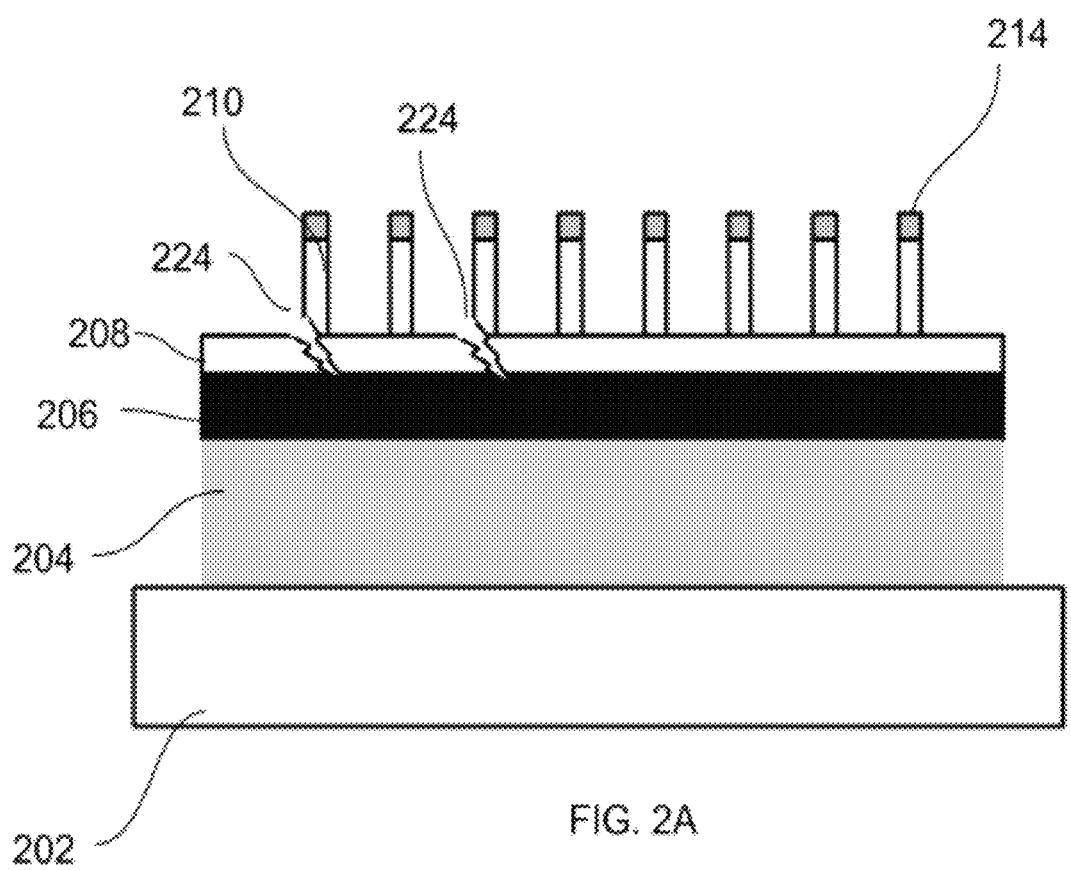
FIG. 2A is a schematic cross-sectional diagram illustrating defects underneath the nanopillars, in accordance with an embodiment of the invention.

FIG. 2A highlights defects 224 at least partially underneath the nanopillars 210. Here, to develop a vertical optoelectronic device, planar layers 204, 206, 208 with different functionalities such as buffer layers, doped layers, and quantum wells, are formed on top of a substrate 202. Then, the nanopillars 210 are formed through either etching or on top of the planar layers of the device. The nanopillars can have nano contacts 214 on the top surface.

Figure 2B:
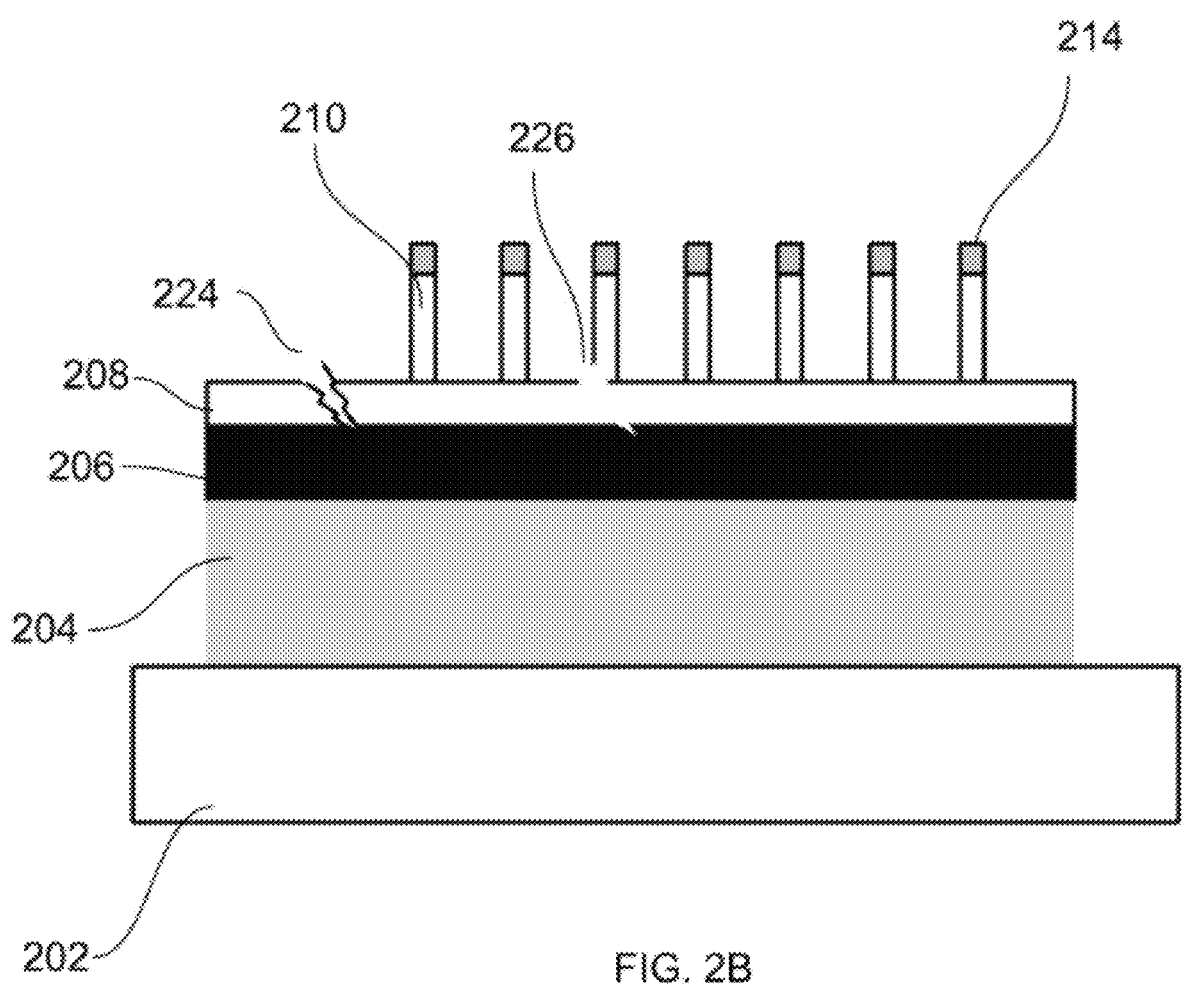
FIG. 2B is a schematic cross-sectional diagram illustrating different methods to manage the defects underneath the nanopillars, in accordance with an embodiment of the invention.

FIG. 2B shows different methods to manage the defects that are partially or fully underneath the nanopillar. Here, the nanopillar is at least partially deactivated. In one case, the nanopillar 210 on top of the defect 224 is eliminated. An etching and sonication or combination of both processes can be used to remove the nanopillar on top of the defects. In another case, the defect 226 is exposed by some treatment such as etching. In another case, the formation of nanopillars is controlled with the defects map so that no nanopillar is formed on top of a defect. Here, the surface of the planar layers is investigated to map the defects. The defect map is then used to control the formation of nanopillars on defective areas by adjusting the position of the nanopillars.

Figure 2C:
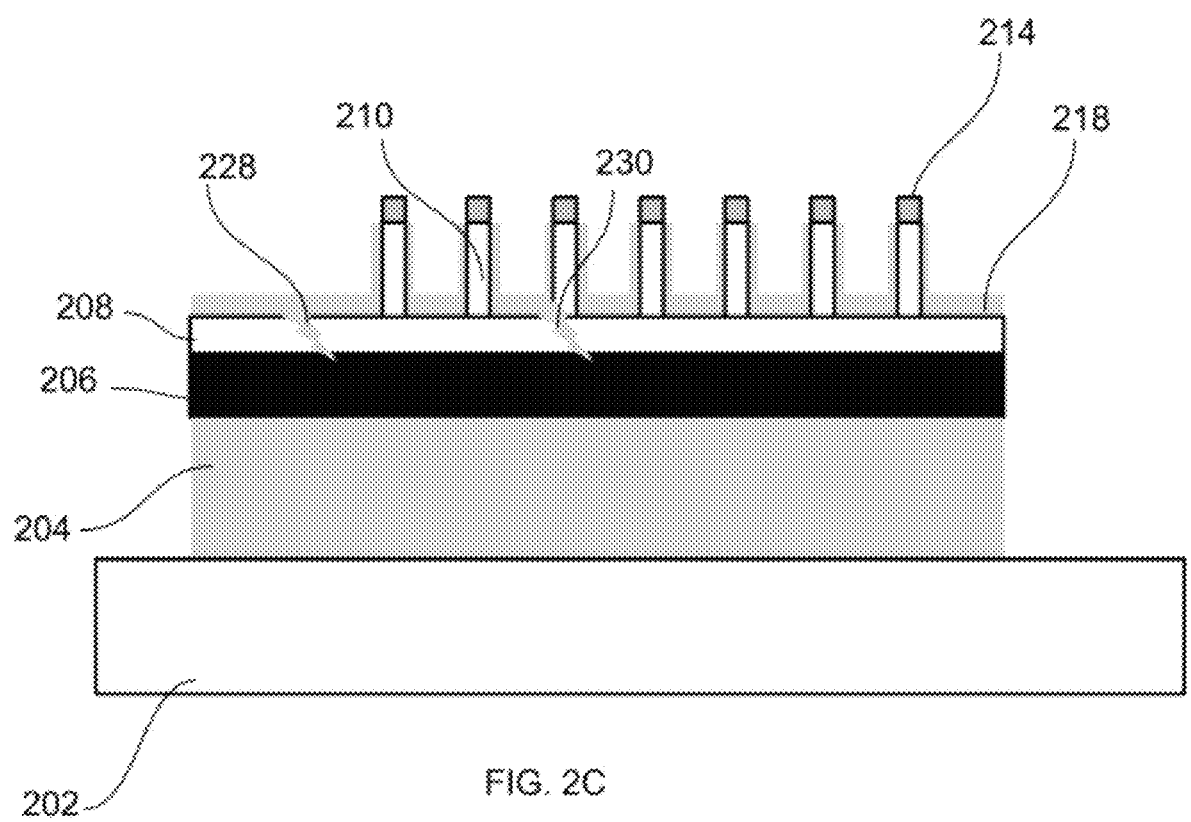
FIG. 2C is a schematic cross-sectional diagram illustrating the formation of a passivation layer to cover a surface of the nanopillars and/or exposed defects, in accordance with an embodiment of the invention.

FIG. 2C shows another cross-section highlighting the formation of a passivation layer to cover a surface of the nanopillars and/or exposed defects. After surface treatment, a passivation layer 218 may be formed. In one embodiment, after the surface treatment, the surface between the nanopillars 210, the sidewalls of the nanopillars 210, or the exposed defects 228, 230 can be passivated using different film layers such as a dielectric layer. In one case, a passivation layer 218 is formed on the sidewalls of the nanopillars 110. The passivation layer 218 includes a dielectric material, such as silicon oxide, silicon nitride, silicon oxynitride, silicon carbide, or another suitable dielectric material. Also, high bandgap materials can be used as passivation layers to cause band bending at the interface with the defects and push the charge away from the surface. In one case, a filler layer may substantially fill in the spaces between the nanopillars 210. In another example, the spaces are filled with more than one dielectric material film.

In this embodiment, each nanopillar 210 can include a tip 214 and sidewalls. The nanopillar tip needs to be exposed to connect to either an electrode or a pad. Furthermore, using a dry etch process to open the nanopillar tips after passivation or filler layers removes the passivation layer from the surface between the nanopillars and the top of the nanopillars, and keeps this layer on the side of the nanopillars and inside the affected areas. The passivation layer 218 is formed on the sidewalls and the bottom surface of the nanopillars 210 and a filling material further fills in the spaces. The passivation layer 218 covers the space between the nanopillars or the sidewalls.

In another case, chemical mechanical polishing (CMP) is used to expose the tip of the nanopillars.

In one method, the bottom side of the nanopillars is covered by a film such as sol gel, and then the exposed top part is etched to open the top part of the nanopillar.

In another case, the planarization (or filler) layer is used to fill the space between the nanopillars. Then, an etch back process may expose the tip of the nanopillars covered with passivation. After this, the passivation layer can be removed from the exposed tips with either wet or dry etching, or CMP.

Figure 2D:
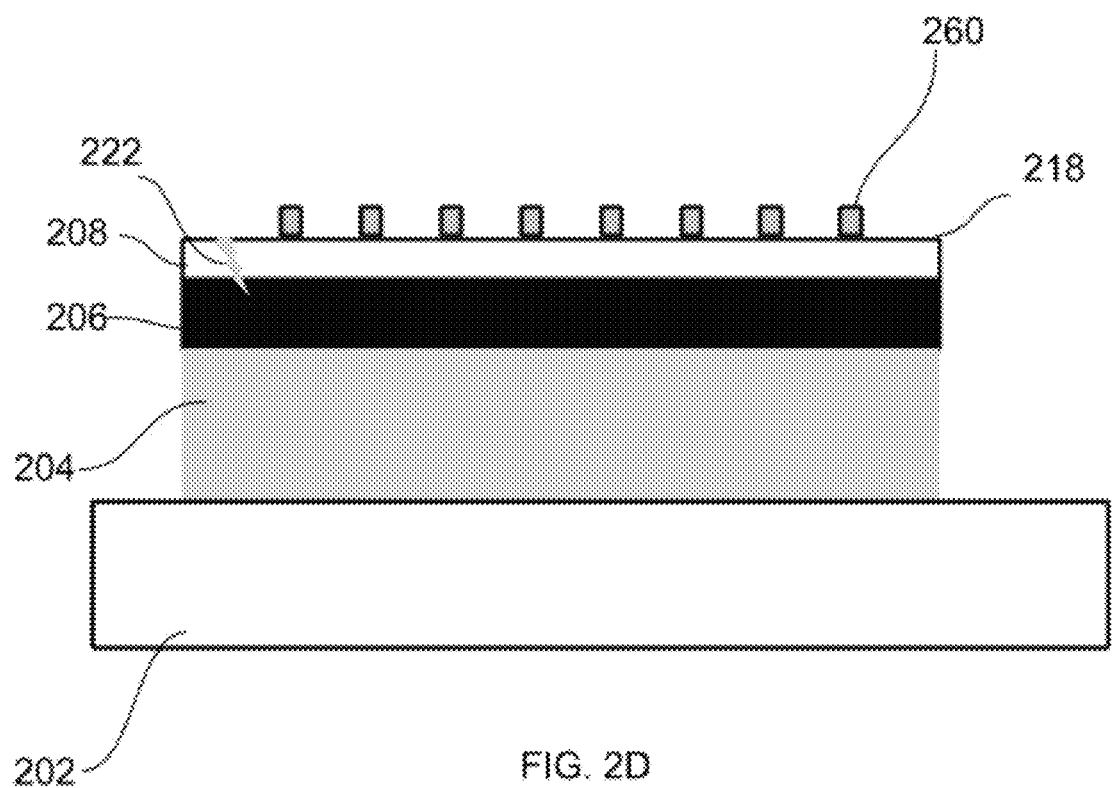
FIG. 2D is a schematic cross-sectional diagram illustrating a seed layer to create the nanopillars, in accordance with an embodiment of the invention.

FIG. 2D shows an embodiment where a seed layer 260 is used after passivation layer 218 to create the nanopillar. The passivation layer 218 can be formed after the seed layer 260 and the nanopillars. Here, the seed layer 260 can be used as either a deposited layer or a surface treatment.

Figure 2E:
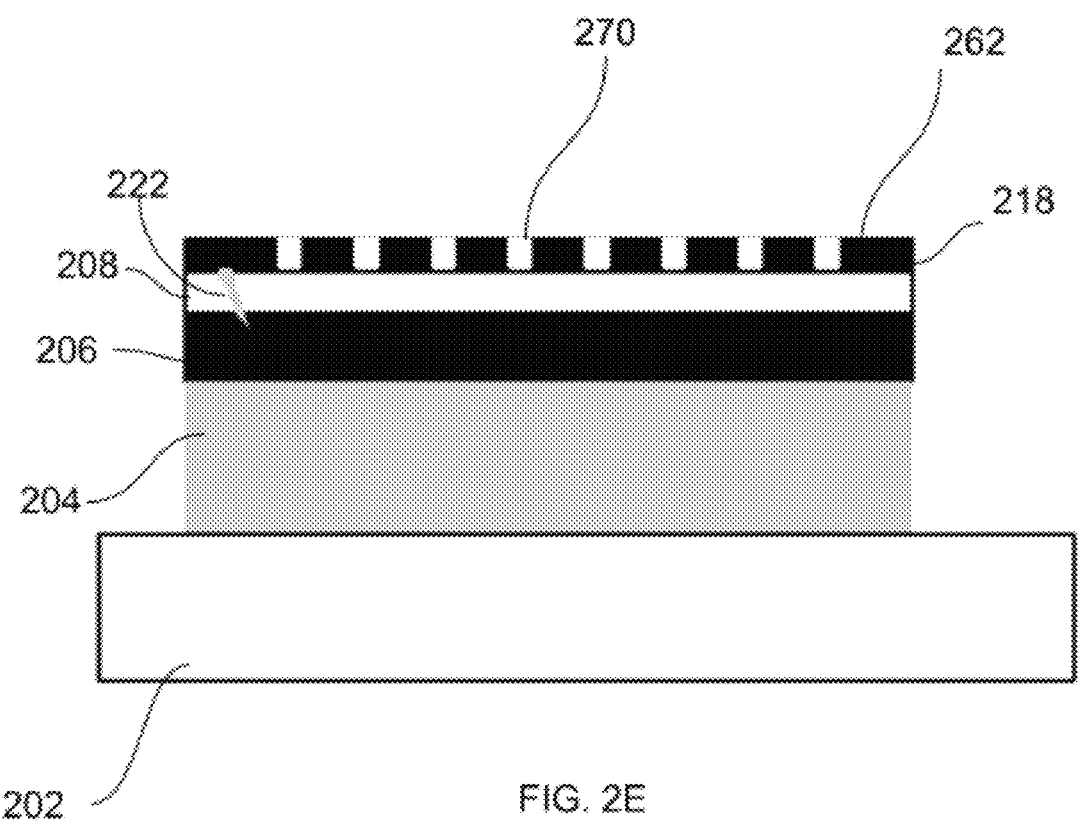
FIG. 2E is a schematic cross-sectional diagram illustrating a blocking layer to create the nanopillars, in accordance with an embodiment of the invention.

FIG. 2E shows an embodiment where a blocking layer 262 is used after passivation to create the nanopillar. Here, the blocking layer 262 has an opening where the nanopillar can grow. The blocking layer 262 can be the passivation layer 218. A combination of the seed layer 260 and blocking layer 262 can also be used to create the nanopillars.

Figure 2F:
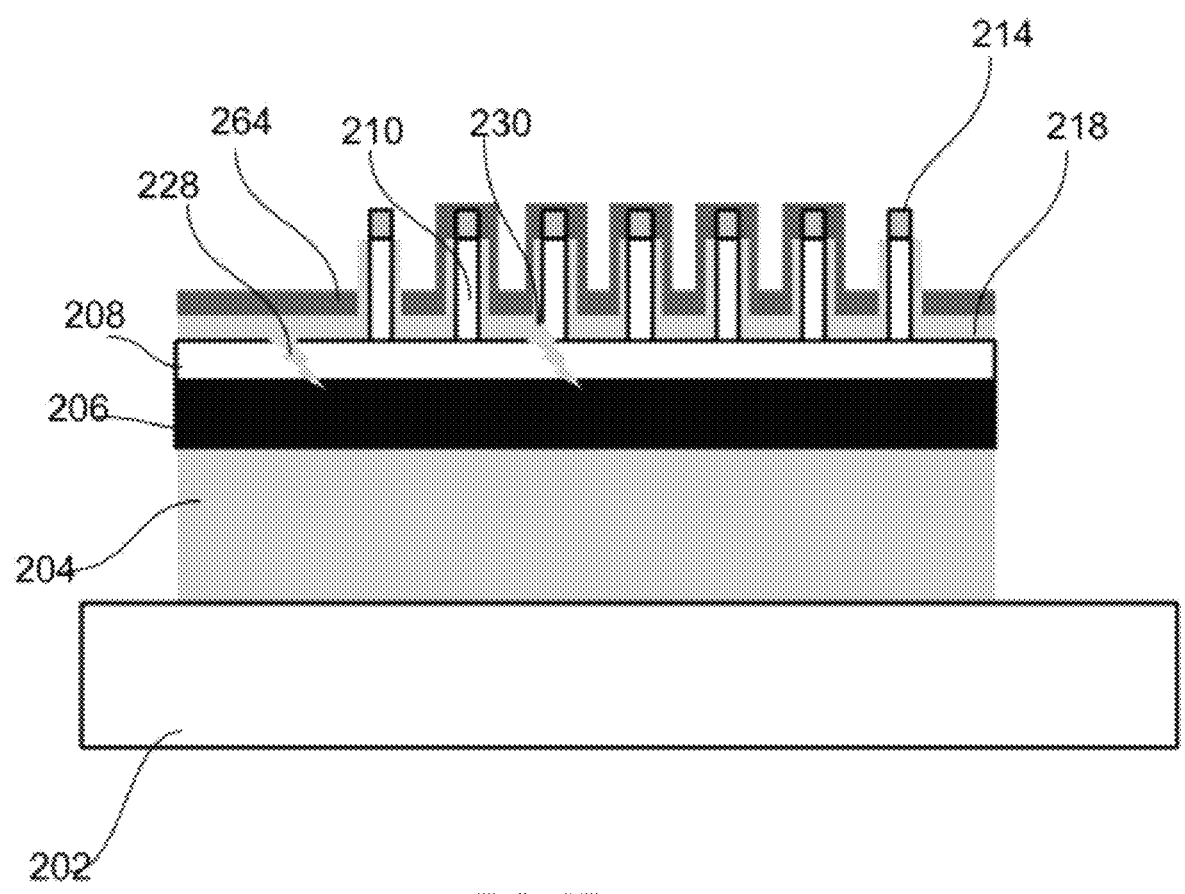
FIG. 2F is a schematic cross-sectional diagram illustrating an electrode that covers a space between the nanopillars and a part of the nanopillar sidewalls, in accordance with an embodiment of the invention.

FIG. 2F shows an embodiment wherein the electrode 264 covers the space between the nanopillars 210 and a part of the nanopillar sidewalls. However, in one case, it only covers the space between the nanopillars 210. The electrode 264 can be part of nanocontacts 214. In another case, a separate electrode may covers the passivation layer 218 between the nanopillars 210. The electrode 264 can also have other functions like a filler or optical property, such as a reflector.

Figure 2G:
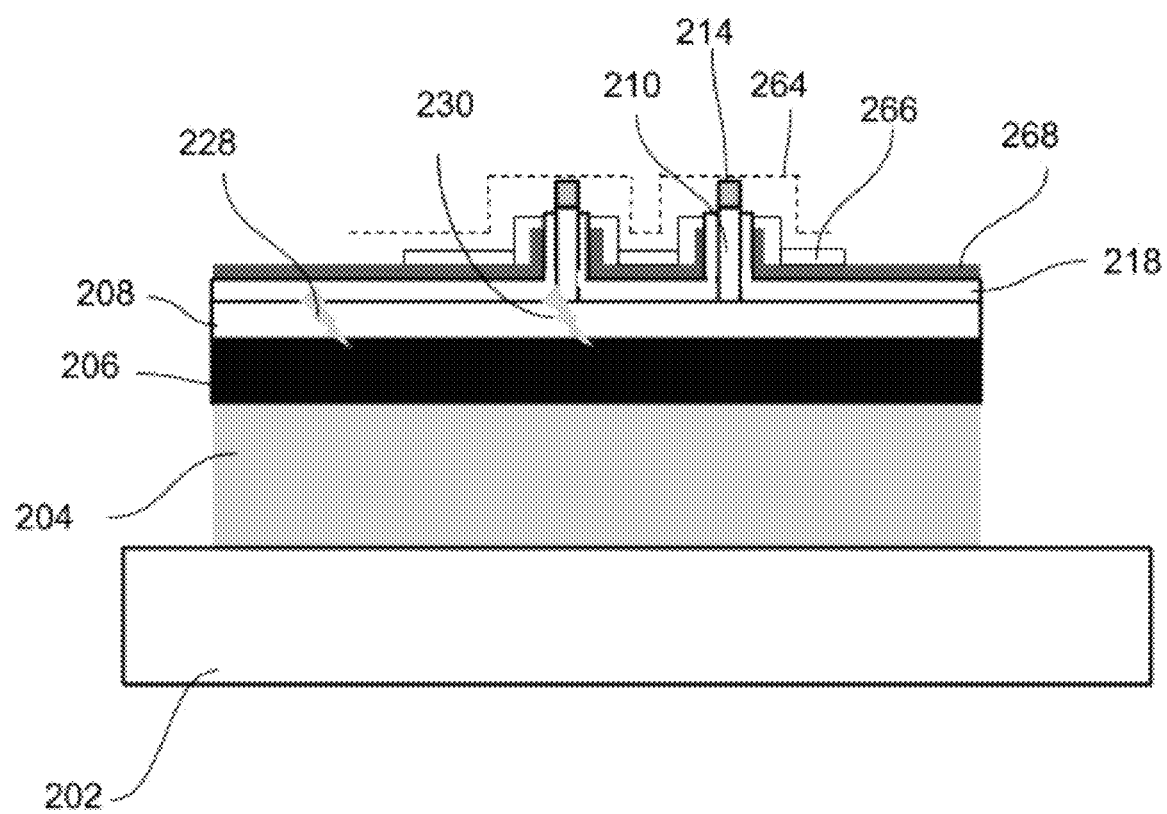
FIG. 2G is a schematic cross-sectional diagram illustrating a gate electrode, in accordance with an embodiment of the invention.

FIG. 2G shows an embodiment highlighting a gate electrode, in accordance with an embodiment of the invention. Here, to develop a vertical optoelectronic device, planar layers 204, 206, 208 with different functionalities such as buffer layers, doped layers, and quantum wells, are formed on top of a substrate 202. Then, the nanopillars 210 are formed through either etching or on top of the planar layers of the device. The nanopillars can have nano-contacts 214 on top of the nano-pillars. Etching the space between the nanopillars and sidewalls of the nanopillars can expose some of the non-idealities (e.g., defects, dislocations, or particles). A passivation layer 218 can be formed to cover at least part of the surface and/or expose defects 228, 230. The passivation layer 218 covers the space between the nanopillars or the sidewalls. The passivation layer 218 may include a dielectric layer and may be considered as a first passivation layer. A gate electrode 268 may be sandwiched between the first passivation layer 218 and a second passivation layer 266, wherein the second passivation layer 266 separates the gate electrode 268 and the device electrode 264, and the first passivation layer 218 separates the gate electrode 268 from the device surface and the nanopillar sidewalls. The device electrode 264 can be part of the nanocontacts 214. In another case, a separate electrode can cover the passivation layer 218 between the nanopillars 210. The electrode 264 can also have other functions like a filler or optical property, such as a reflector.

The gate electrode 268 can be used to bias the nanopillars 210 to control the charge accumulated on the surface of the nanopillars and/or control the current passing through the nanopillars 210.

Figure 2H:
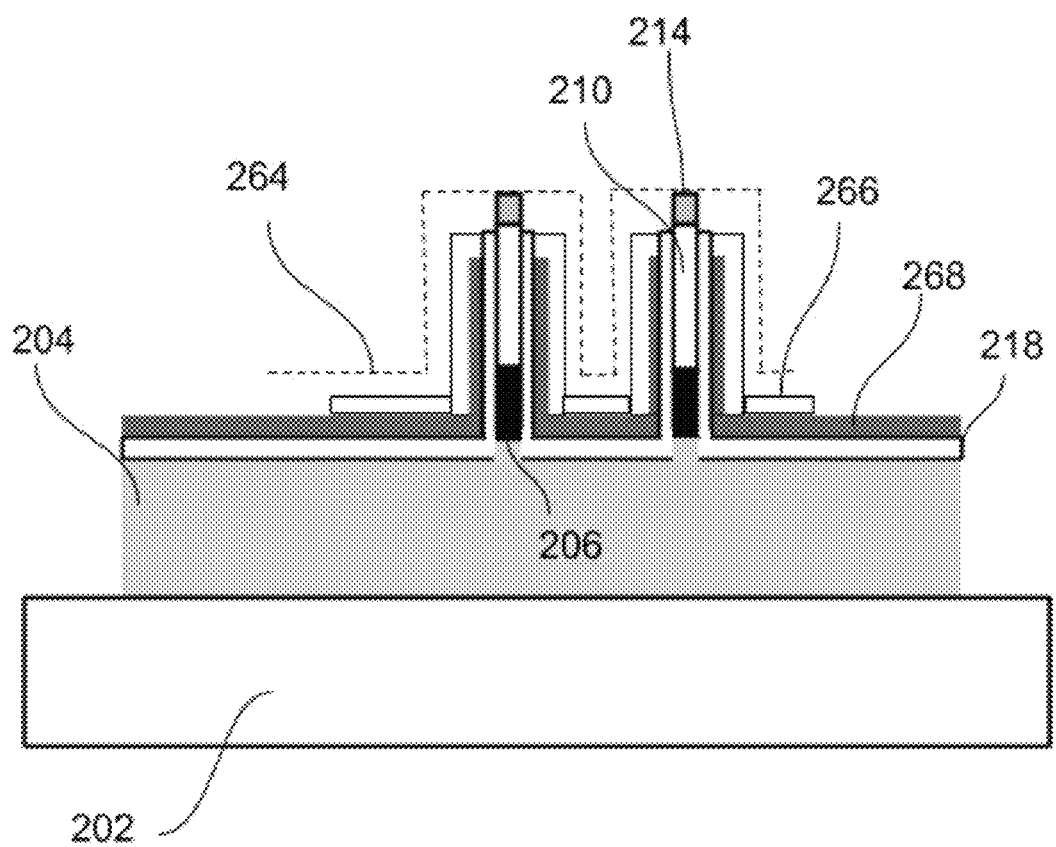
FIG. 2H is a schematic cross-sectional diagram illustrating a gate electrode, in accordance with an embodiment of the invention.

FIG. 2H shows an embodiment highlighting a gate electrode formed over the passivation layer 218. A gate electrode 268 is sandwiched between a first dielectric layer 218 and second dielectric layer 266, wherein the second dielectric layer 266 separates the gate electrode 268 and the device electrode 264, and the first dielectric layer 218 separates the gate electrode 268 from the device surface and the nanopillar wall. In this embodiment, the nanopillars 210 are further etched to other layers such as quantum well layers 206. The device electrode 264 can be part of the nanocontacts 214. In another case, a separate electrode covers the passivation layer 218 between the nanopillars 210. The electrode 264 can also have other functions like a filler or optical property, such as a reflector. The gate electrode can be used to bias the nanopillar layer to control the charge accumulated on the surface of the nanopillar and/or to control the current passing through the nanopillar.

Figure 3:
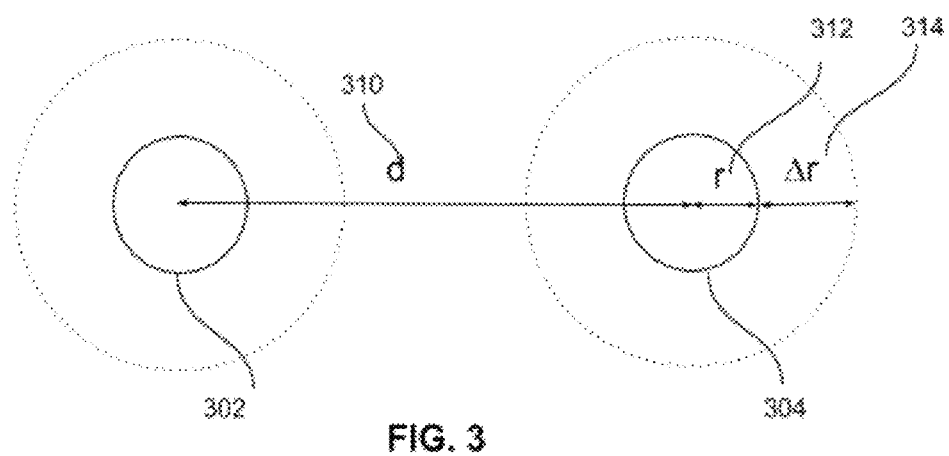
FIG. 3 shows two adjacent nanopillars with a fixed physical radius and distance, in accordance with an embodiment of the invention.

FIG. 3 shows two adjacent nanopillars 302, 304 with a fixed physical radius of r 312 and distance apart d 310. The nanopillar effective size can increase based on current density. This increase is shown as $\Delta r$ 314.

Figure 4:
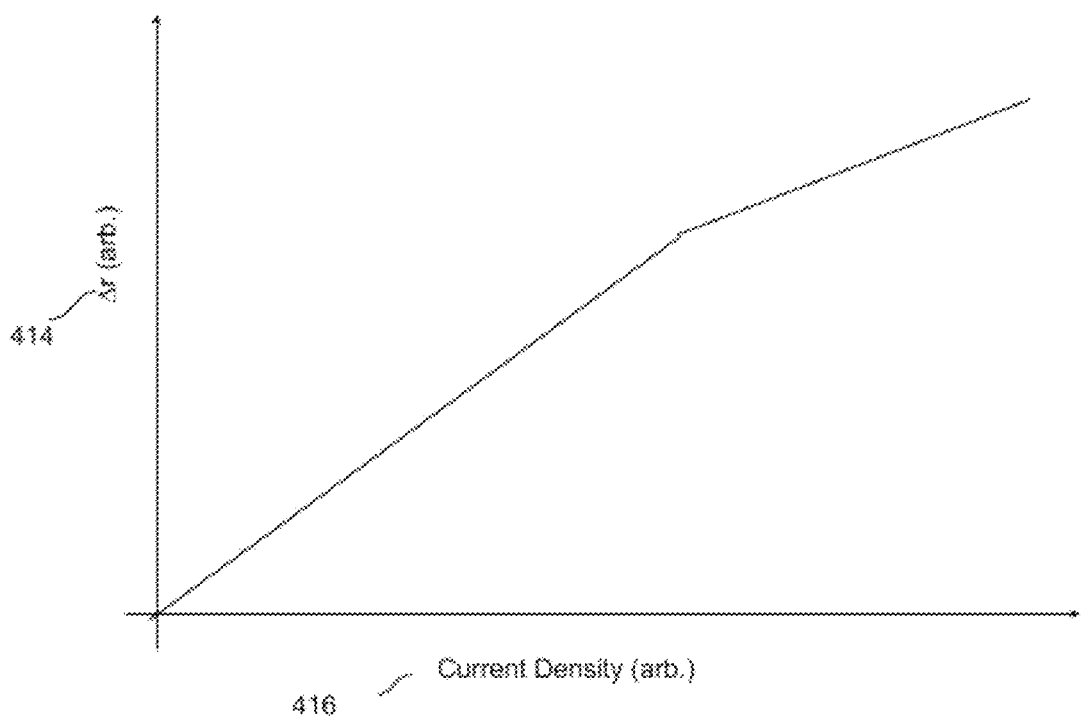
FIG. 4 shows a graphical representation of the radius relationship of the nanopillar and the current density of a microdevice, in accordance with an embodiment of the invention.

FIG. 4 shows the increase in the radius $\Delta r$ 414 of the nanopillars versus the current density 416. Therefore, the nanopillar effective current density is dropped. In general, most of the microdevices have a peak efficiency at a certain effective current density. To expand the peak efficiency to a wider current density range and also make sure that the microdevice operates at its best performance, the size and density of the nanopillar can be adjusted based on the operation range of the microdevice and the peak efficiency of the microdevice.

In one example, the microdevice peak efficiency occurs at $J_{max}$ and the operating current of the microdevice is $I_{op}$. To make sure that the microdevice is operating at its maximum efficiency, the size and the number of nanopillar per microdevice is calculated so that $I_{op}/(A \cdot n)$ is around $J_{max}$, where $I_{op}$ is the operation current, A is the effective area of the nanopillar, and n is the number of nanopillar per microdevice.

In another example, the microdevice has an operation range of between $I_{op1}$ and $I_{op2}$, where $I_{op1} < I_{op2}$. Here the size and number of microdevices are optimized so that the $I_{op1}/(A_1 \cdot n)$ and $I_{op2}/(A_2 \cdot n)$ are close to the $J_{max}$, where $A_1$ is the effective nanopillar area for $I_{op1}$, and $A_2$ is the effective nanopillar area for $I_{op2}$.

The aforementioned embodiments can be applied to larger pillars (micrometer size) as well.

Some embodiments of the present disclosure highlight some structures with larger pillars. In some cases, the structure can be modified specifically to fit better with the larger pillars. These structures can further confine the current or can also prevent or enhance the current spreading from the large pillar/nanopillar area to the adjacent area.

Methods for manufacturing structures with larger pillars are described. Conventionally, microLED devices grown on a common, e.g. sapphire, substrate. Each LED may comprise a substrate, a first doped conductive layer, e.g. n-type layer, active layers, and a second doped conductive layer, e.g. p-type layer, formed on the substrate. Then, ohmic, e.g. p-type, contact may be deposited on the microdevice/mesa structures. The following structures are described with reference to a Gallium Nitride-based (GaN) LED; however, the presently described vertical device structure may be used for any type of LEDs with different material systems.

The present disclosure further relates to embodiments wherein the conductive/doped layer is thinned for some areas outside the ohmic contact/microdevice electrode. It is possible that both parts, such as the area underneath the ohmic contact/microdevice electrode, are thin or thinned prior to the next steps.

The conductive/doped layer may be thinned to reduce the light scattering effect. The thickness and conductivity of the doped layers is manipulated to control the lateral conduction. This may be done by either etching of the deposited doped layer or by depositing a thinner conductive layer. The thickness of the conductive layers between adjacent devices is reduced to make a higher resistance for the current to flow in the lateral direction. An etching process may be done using, for example, dry etching, wet etching or laser ablation.

Figures 1, 5A:
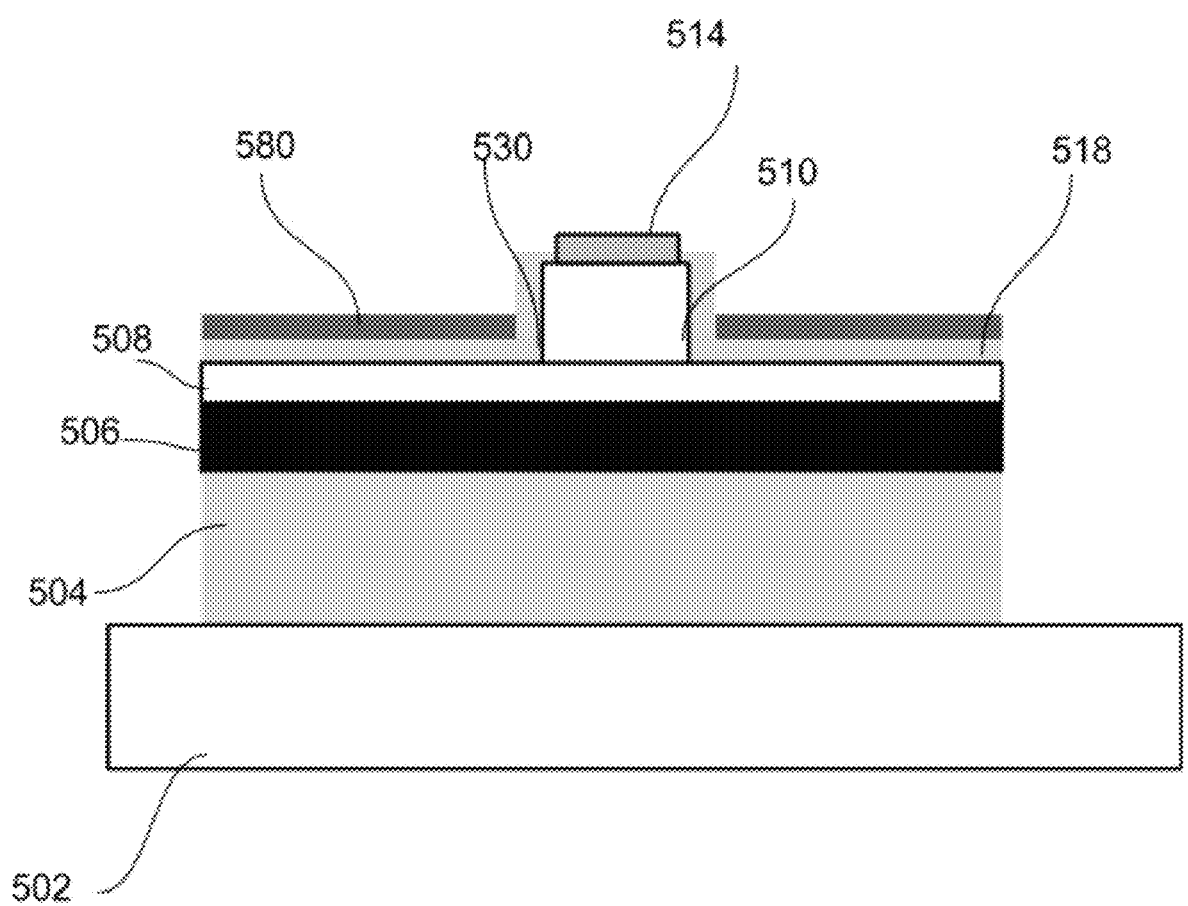
FIG. 5A-1 is a schematic cross-sectional diagram illustrating the formation of a passivation layer or an electrode around a microdevice, in accordance with an embodiment of the invention.

FIG. 5A-1 highlights the formation of a passivation layer or dielectric layer 518 to cover at least part of the thinned conductive/doped layer 508. First, a plurality of planar layers such as 504, 506, 508 with different functionalities such as buffer layers, quantum wells, doped layers are formed on top of a substrate 502 to develop a vertical microdevices. After that, the microdevice can be formed through etching of top planar layers of the substrate 502. The conductive/doped layer 508 may be thinned prior to the next step. A passivation layer or dielectric layer 518 may be formed to cover an area covering at least a part of the thinned conductive/doped layer 508 and also the area 510 that is not thinned. Also, there can be a conductive layer/electrode 580 covering at least part of the other areas on the surface different from the contact areas of the device. The microdevice can have contacts on top as an ohmic contact 514 deposited over an area 510 that is not thinned.

Figures 2, 5A:
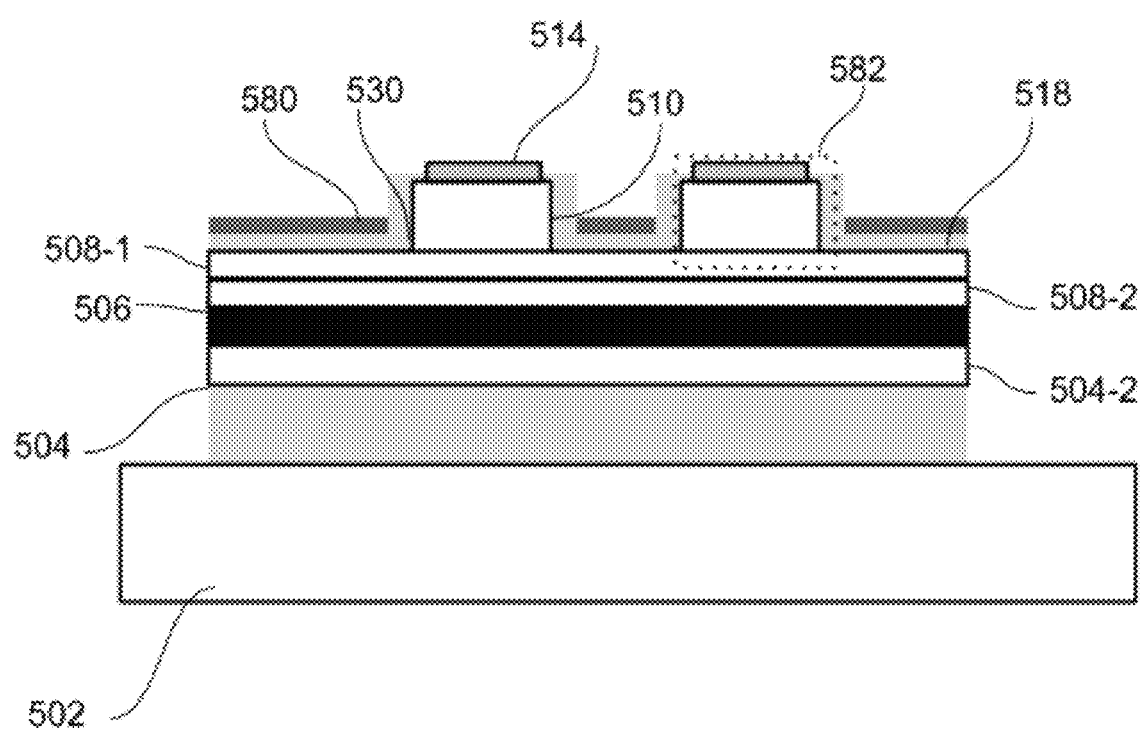
Figures 3, 5A:
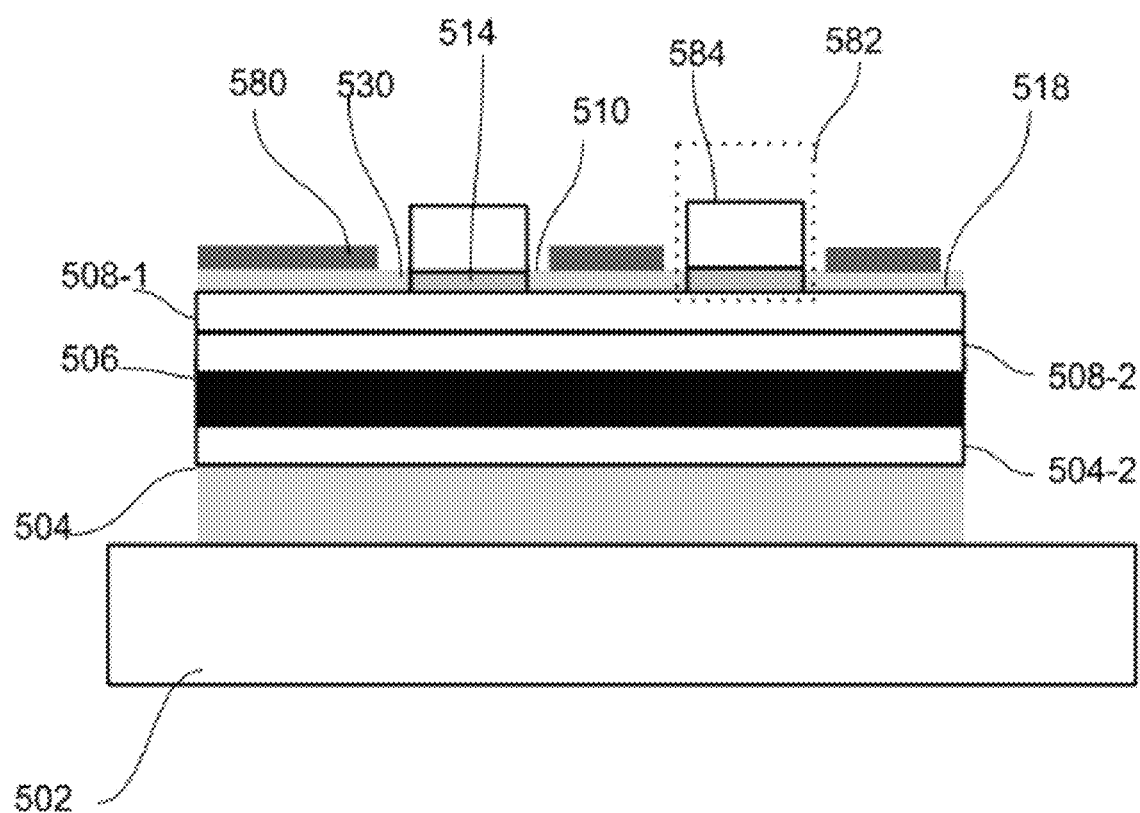
Figures 4, 5A:
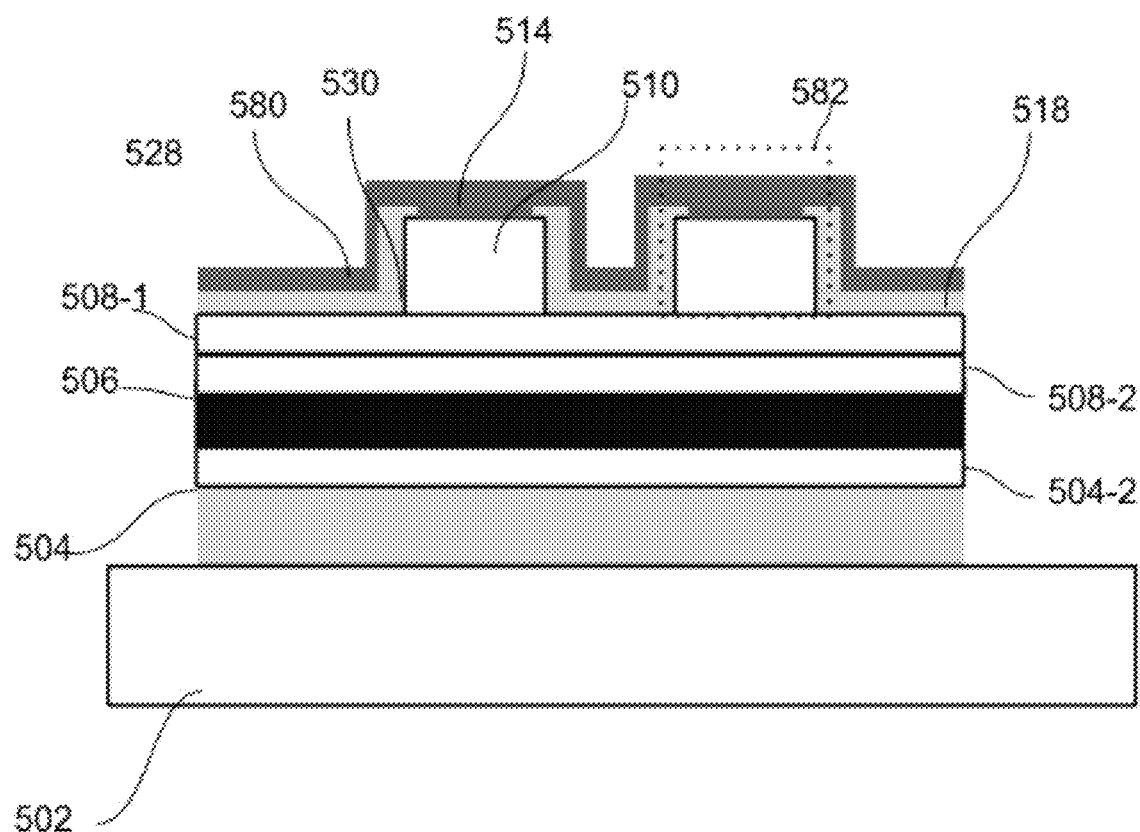

FIG. 5A-2 shows a cross-section highlighting more than one area of contact for the microdevice, in accordance with an embodiment of the invention. Here, the conductive/doped layer 508 can consist of a thinned doped layer 508-1, and other layers 508-2 such as a current blocking layer. The thin layer 508-1 can be between 1 nm to 1000 nm. This can be applied to all the examples presented here. In this embodiment, the thickness of the conductive layer 508-1 is reduced in selected areas to make a higher resistance for the current to flow in the lateral direction. Further, there can be more than one area for the contact 582 for the micro device other than ohmic contact 514. The contact 582 can be a stack of extra doped layer, ohmic contact 514, and pads. Also, there can be an electrode 580 covering at least part of the other areas on the surface different from the contact areas (514, 582). For larger microdevice, the extra contact 582 can improve the current density and provide for redundancy to improve the yield.

FIG. 5A-3 shows an example where ohmic contact 514 is a part of the microdevice. In one embodiment, a dielectric layer 518 can be used between the ohmic contacts. In another embodiment, there is no dielectric layer 518 between the ohmic contacts.

FIG. 5A-4 shows another example where the electrode 580 is deposited over the microdevice and coupled with ohmic contact 514. The dielectric layer 518 is covering on or around the sidewalls of the microdevice.

Figures 5, 5A:
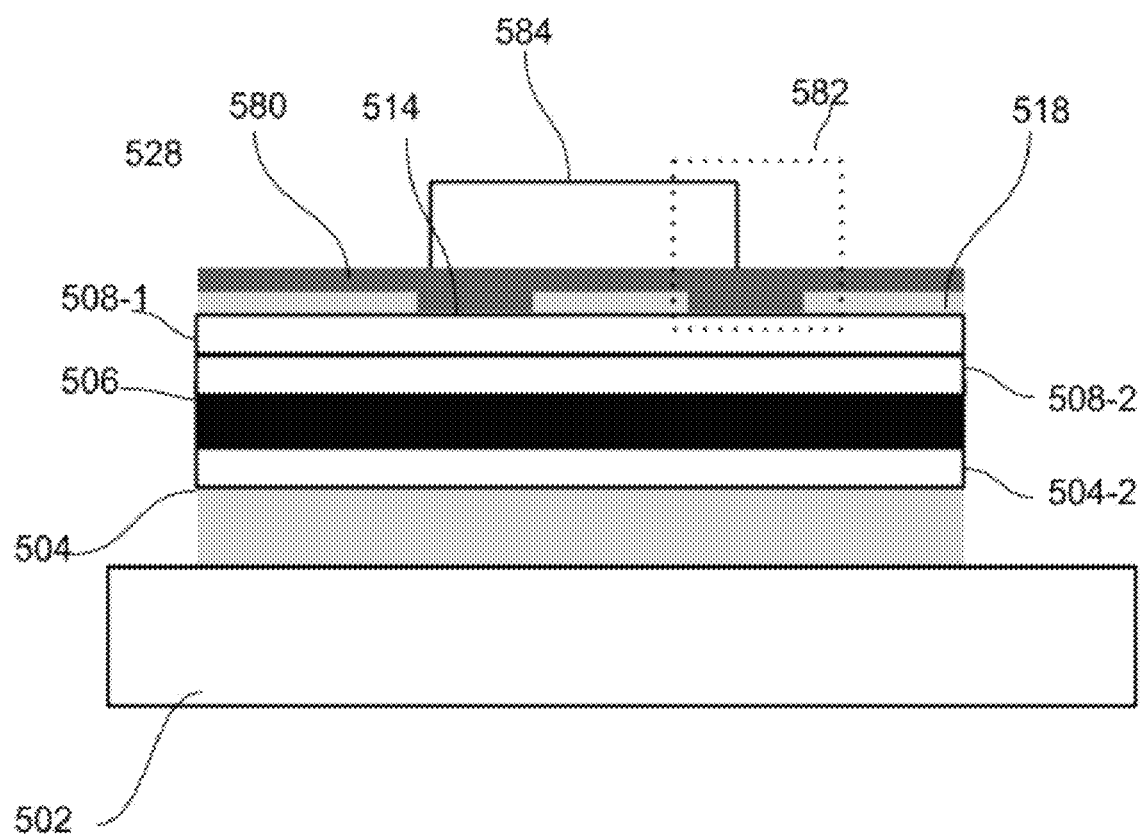

FIG. 5A-5 shows an example of FIG. 5A-4 where only ohmic contact 584 is part of the contact 582. FIG. 5A-1 to FIG. 5A-5 can be used for other structures in the panel. For instance, a dielectric layer 518 can be used between the ohmic contacts (514, 580). In another, there is no dielectric layer 518 between the ohmic contacts. A pad 584 can be formed on top of the layer 518 or it can be part of the layer 518. The pad can be used to improve electrical connection between the microdevice and other components.

Figure 5B:
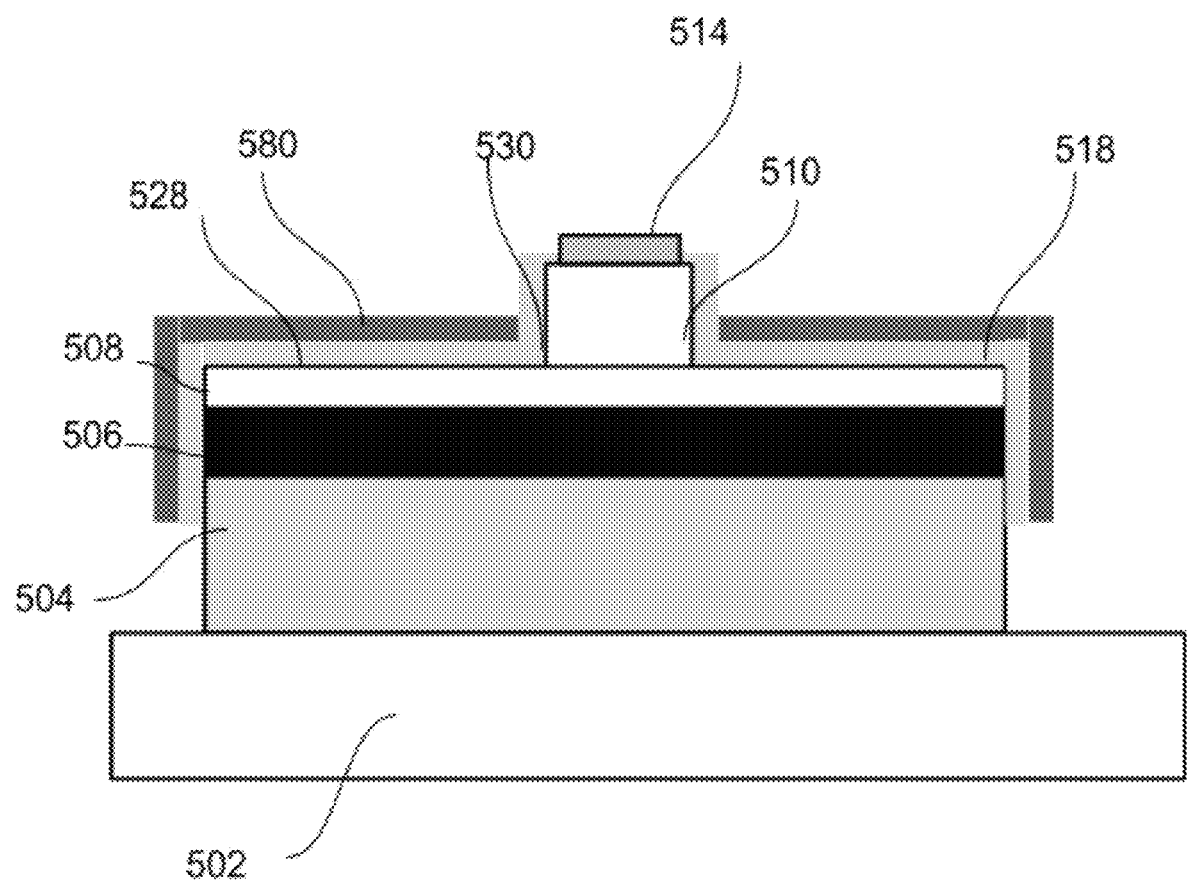
FIG. 5B is a schematic cross-sectional diagram illustrating the dielectric layer covering the sidewalls of the thinned area, in accordance with an embodiment of the invention.

FIG. 5B shows that the dielectric layer 518 can cover the sidewalls 530 of the thinned area and also that area of that is not thinned. The electrode 580 is covering the sidewalls of the thinned area.

Figure 5C:
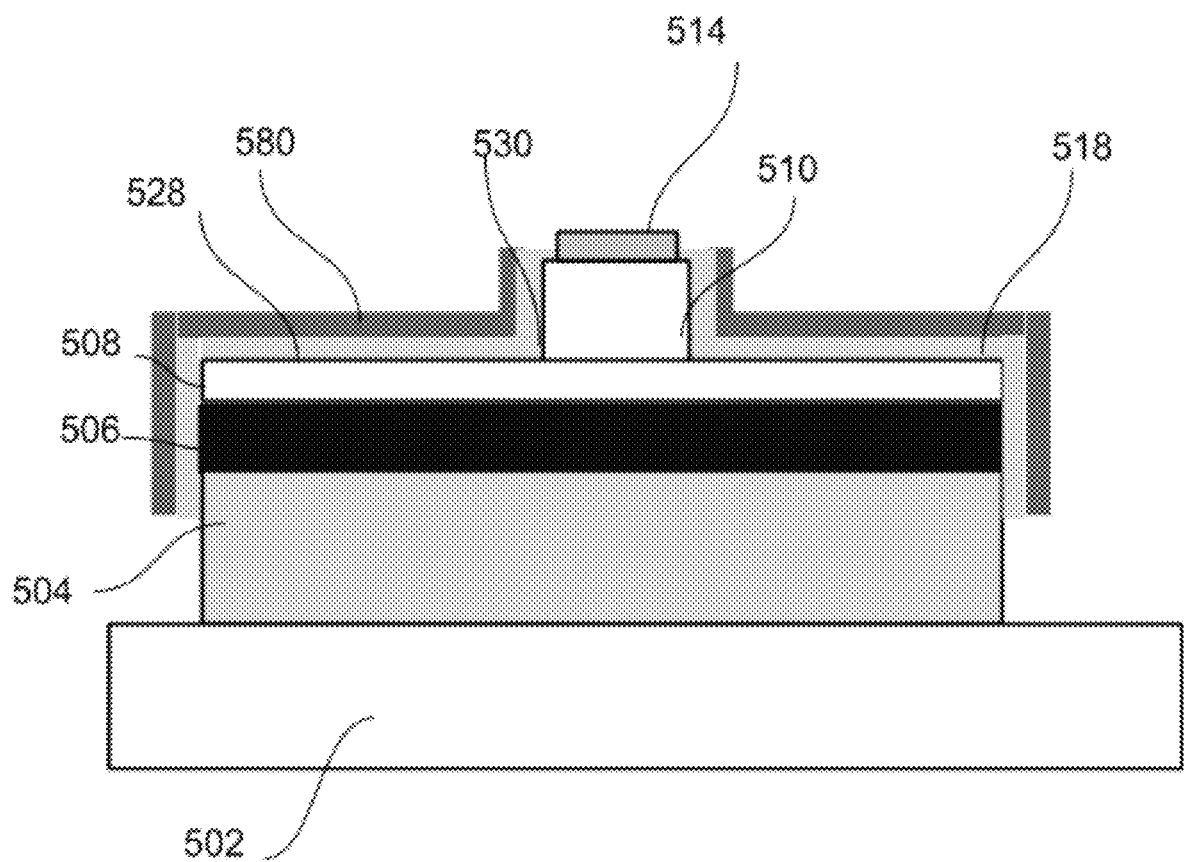
FIG. 5C is a schematic cross-sectional diagram illustrating the dielectric layer covering the sidewalls of the microdevice, in accordance with an embodiment of the invention.

FIG. 5C highlights the dielectric layer 518 covering the sidewalls of the device. A conductive (e.g., metal) layer 580 can be formed and patterned on top of the dielectric layer 518. This metal layer 580 acts as a gate controlling the spread of the current to the surface of the microdevice.

Figure 5D:
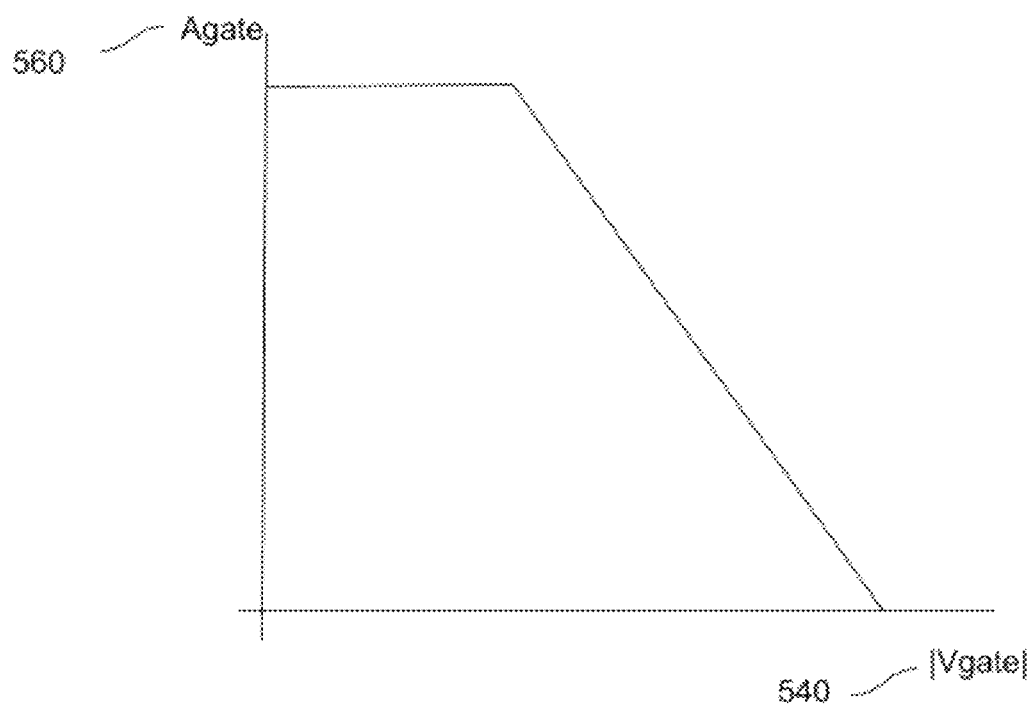
FIG. 5D shows a graphical representation of the area relationship between the vertical device and the gate voltage, in accordance with an embodiment of the invention.

FIG. 5D shows a graphical representation of the area relationship between the vertical device and the gate voltage, in accordance with an embodiment of the invention. As shown in FIG. 5D, the voltage, Vgate 540, applied to the metal layer 580, controls the effective area, Agate 560, underneath the gate that can contribute to the microdevice performance. As a result, depending on the required performance, the area can be adjusted as $A_{total} = A_{electrode} + A_{gate}$, where $A_{total}$ is the total effective area, $A_{electrode}$ is the area underneath electrode 514, and $A_{gate}$ is the effective area controlled by the gate 580. For example, for microLEDs, efficiency is a function of current density, which is a function of effective area. For a given current, the Vgate can be adjusted to push the current density into an optimized region. The voltage adjustment can be customized per microdevice. For an array of microdevices, the adjustment per microdevice may require significant overhead. To address that, the gate voltage (Vgate) can be adjusted per block of microdevices. Here, an optimized voltage can be calculated for the best performance for the block. In another case, time modulation can be used to accommodate more than one gate voltage per block of microdevices.

Figure 6A:
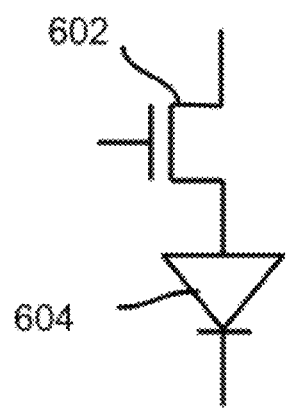
FIG. 6A shows an example of the effective area acting as a vertical transistor in series with the microdevice, in accordance with an embodiment of the invention.

FIG. 6A shows an example of the effective area acting as a vertical transistor in series with the microdevice, in accordance with an embodiment of the invention. In another embodiment, the width of the doped area 510 demonstrated in FIG. 5 that is not thinned is narrowed enough so that applying a voltage to the gate covering the sidewall controls the entire current passing through area 510, and area 510 acts as a vertical transistor 602 in series with the microdevice 604 (FIG. 6A).

Figure 6B:
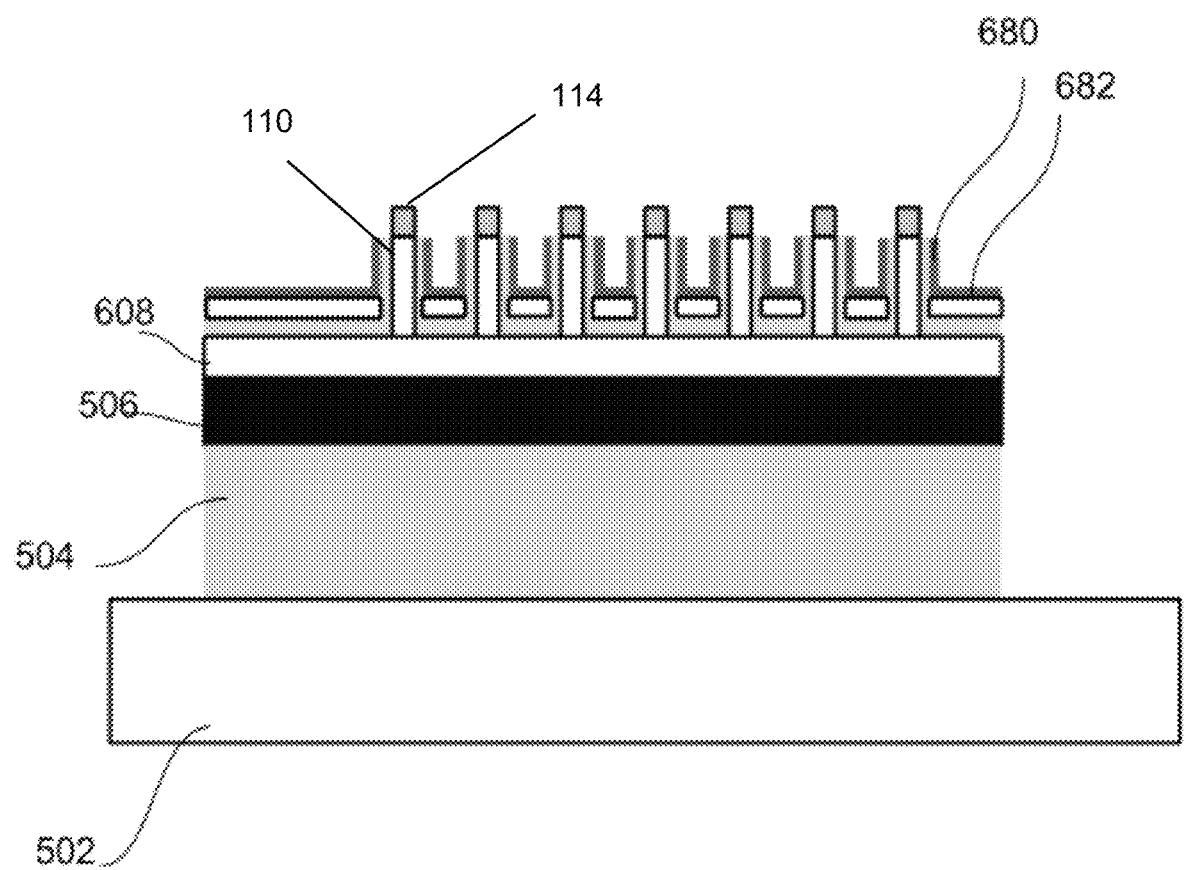
FIG. 6B shows an example of multiple vertical transistors used per microdevice, in accordance with an embodiment of the invention.

FIG. 6B shows an example of multiple vertical transistors used per microdevice, in accordance with an embodiment of the invention. As demonstrated in FIG. 6B, the gate 680 can cover the surface of thinned area 608 or the sidewalls of the device. In this case, another dielectric or stack of dielectric layers 682 can be used for the surface or the sidewall of the device so that the gate has a different effect on the vertical transistor versus the surface or sidewall of the device. Another dielectric layer can cover the gate metal so that forming a top contact 114 to the nanopillars 110 do not create short. The gate structure can be around more than one nanopillar 110 and in this case, multiple vertical transistors can be formed per device.

Post Processing Steps after Bonding of Microdevices/Nano-Pillars with a Temporary Substrate All the aforementioned structures can be done on the native substrate or on the layers transferred to a native substrate. In this case, part of the microdevice can be formed on the native substrate and after bonding to a temporary substrate, the structure is lift-off and further development can be done after the lift-off process. The following descriptions highlight the process steps after lift-off process that can be applied to nanopillars or larger pillars.

Figure 7A:
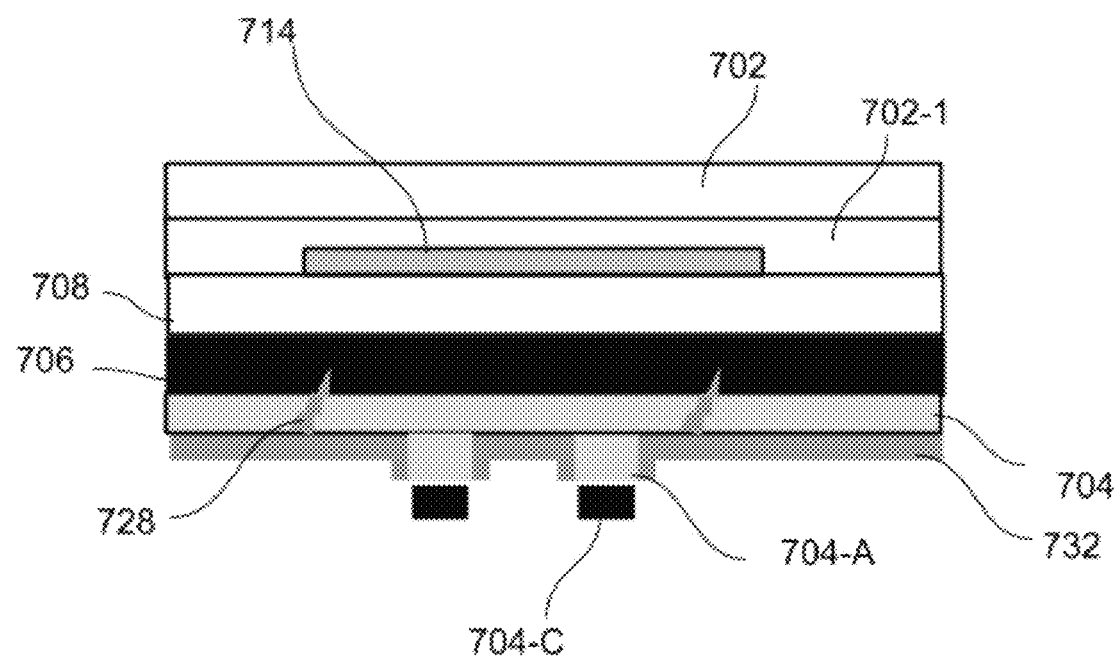
FIGS. 7A-7C are schematic cross-sectional diagrams illustrating process steps after the lift-off process is applied to nanopillars or larger pillars, in accordance with an embodiment of the invention.

FIG. 7A shows a cross-section highlighting microdevices bonded to a temporary substrate, in accordance with an embodiment of the invention. In one embodiment, the microdevices are partially or fully processed on a donor substrate. The donor substrate comprises different conductive layers 704 and a plurality of planar active layers 706 are deposited on top of the donor substrate, followed by other conductive/doped layers 708. The conductive layers 704 may comprise buffer layers, p-type doped layers, n-type doped layers, charge blocking layers, and an electrode. The active layers 706 comprise a multiple quantum well (MQW) layer, and other conductive layers 708. The MQW layer includes a plurality of single quantum layers in a stack. The conductive layers can be transparent or opaque. The examples of a transparent conductive layer are thin Ni/Au or ITO formed on the p-doped semiconductor layer (e.g., GaN or GaAs) for a better lateral current conduction. The conductive layer can have a stack of different layers. For example, the p-type electrode such as Pd/Au, Pt or Ni/Au is then formed on the transparent conductive layer.

After the vertical device layers are developed and placed properly for processing, one of the top conductive layers (e.g., the n- or p-doped layer) is formed as large pillars/nanopillars/microdevices. In one embodiment, an ohmic contact layer 714 is formed on conductive/doped layers 708.

The microdevices are lifted off from the donor substrate. The microdevices are then bonded to a temporary substrate 702 through a bonding layer 702-1. Etch back may be performed to remove or reduce the thickness of some layers (e.g., charge blocking layer 704, active layers 706). A chemical treatment and passivation are performed on the surface and/or the sidewalls of microdevices. The chemical treatment exposes some of the defects 728 due to growth and lift-off. The passivation layer 732 can be deposited over the charge blocking layers to covers the defects. Here, nanopods (or micropods) can be also used for the ohmic and some of the conductive layers 704-A. Another electrode 704-C or the connection to the ohmic contact 714 after lift-off can be patterned or extended over the passivation layer 732 in the passivation layer.

Figure 7B:
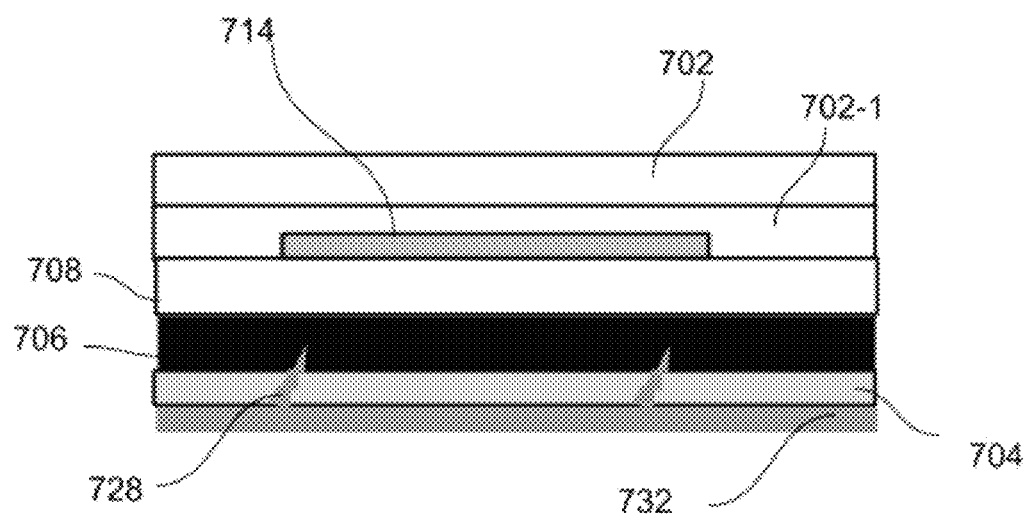

FIG. 7B shows a cross-section highlighting an electrode provided on the passivation layer, in accordance with an embodiment of the invention. In another embodiment, the microdevices are partially or fully processed on a donor substrate. The microdevices are then bonded to a temporary substrate 702 through a bonding layer 702-1. The microdevices are lifted off from the donor substrate. Etch back may be performed to remove or reduce the thickness of some layers (e.g., buffer layer 704-B). A chemical treatment and passivation are performed on the surface and/or the sidewalls. The chemical treatment exposes some of the defects 728 due to growth and lift-off. The passivation layer 732 can be deposited over the charge blocking layer 704 to covers the defects. In this case, the passivation 732 is opened or removed through etch back (or chemical mechanical polishing (CMP)).

Figure 7C:
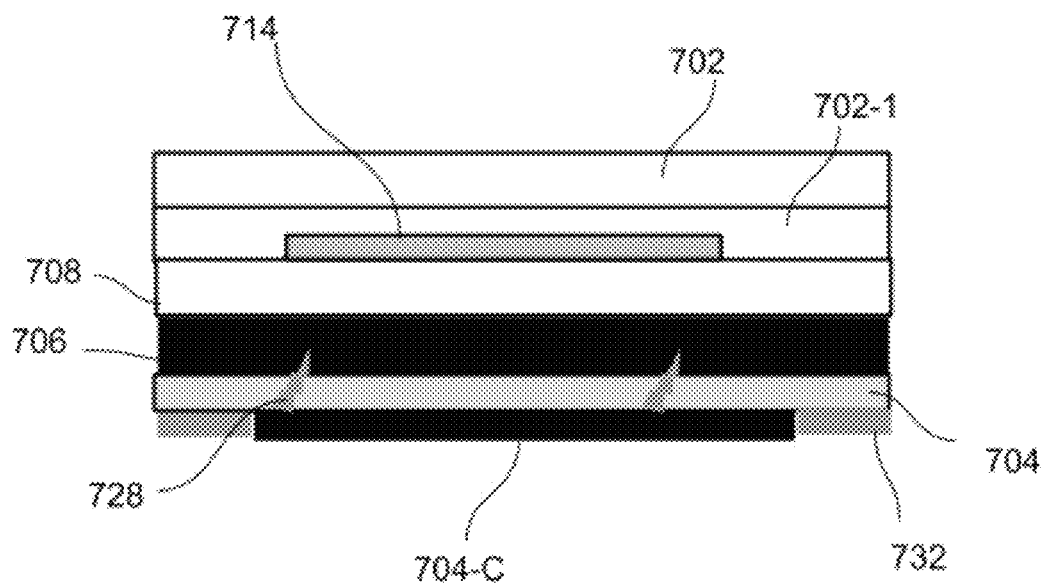

FIG. 7C shows a cross-section where an electrode is coupled with the contact, in accordance with an embodiment of the invention. In one embodiment, an electrode (or ohmic layer) 704-C can be formed so that it connects to the last layer of the microdevice from lift-off side through the opening in the passivation layer 732. In another embodiment, the electrode 704-C can be patterned.

According to one embodiment of the present disclosure, a vertical device is provided. The vertical device comprising a plurality of planar active layers formed on a substrate, at least one of a top layer of the plurality of the layers is formed as a plurality of nano-pillars; and a first passivation layer formed on a space between the plurality of the nano-pillars and at least a part of sidewalls of the plurality of nano-pillars.

According to another embodiment of the present disclosure, the device further comprising a gate electrode formed on part of the first passivation layer covering the space between the nano-pillars and the sidewalls of the nano-pillars.

According to yet another embodiment, a biasing is provided to the plurality of the nanopillars through the gate electrode to control a charge accumulated on a surface of the plurality of nanopillars, or a current passing through the plurality of nanopillars.

According to one embodiment, a second passivation layer formed over the gate electrode, a device electrode formed over the second passivation layer to create a functional area for the vertical device, wherein the device electrode comprises one of: a filler layer or a reflector and an ohmic contact layer formed on a top surface of at least one nano-pillar to create nano-contacts, wherein the device electrode is a separate electrode or a part of nano-contacts.

According to a further embodiment, the plurality of the nano-pillars are etched down to the plurality of planar active layers formed on the substrate. A surface treatment is provided to the first passivation layer to expose defective areas underneath the nano-pillars and remove the nano-pillars placed on the defective areas or a surface treatment is provided to the space between the nano-pillars or the sidewalls of the nano-pillars prior to the formation of the first passivation layer to expose defective areas using a chemical etch or a dry plasma etch process.

According to some embodiments, the nano-pillars on top of defective areas are at least partially deactivated to eliminate the nano-pillars on top of the defective areas. A surface of the active planar layers is investigated to map the defective areas, wherein a defect map is used to control the formation of nano-pillars on the defective areas by adjusting the position of the nano-pillars. A size and a density of the plurality of nano-pillars is adjusted based on an operation range of the vertical device and a peak efficiency of the vertical device.

According to one embodiment, a part of the nano-pillar sidewalls is covered by a dielectric layer and a conductive layer forming a vertical transistor in series of the vertical device, wherein the vertical transistor controls current going through the vertical device. The dielectric layer and the conductive layer are configured to spread to other areas of the vertical device.

According to another embodiment of the present disclosure, the device further comprising a filler layer formed on a top surface of the first passivation layer, the filler layer includes one of: a polymer, a solgel, and a dielectric. The filler layer further includes a color conversion layer.

According to one embodiment, a vertical device may be provided. The device may comprising a plurality of planar active layers formed on a substrate, a thin doped layer formed on one of: a top or a bottom surface of the plurality of active layers, a passivation layer formed to cover at least a part of the thin doped layer; and a conductive layer coupled to the planar active layers through the areas not covered by the passivation layer.

According to another embodiment of the present disclosure, the device further comprising at least one contact on at least an area on the conductive layer, wherein the at least one contact comprises one of: a stack of other doped layers, an ohmic contact and one or more contact pads. The conductive layer acts as a gate layer, wherein a gate voltage applied to the gate layer is adjusted to control an area of the vertical device by controlling the spread of the current to the surface of the vertical device.

According to one embodiment, a method of fabricating a vertical device may be provided. The device may comprising providing a plurality of planar active layers on a substrate, forming a plurality of nano-pillars on at least one of a top layer of the plurality of the layers; and forming a first passivation layer on a space between the plurality of the nano-pillars and at least a part of sidewalls of the plurality of nano-pillars and forming a gate electrode on part of the first passivation layer covering the space between the nano-pillars and the sidewalls of the nano-pillars.

According to another embodiment of the present disclosure, a method of fabricating a vertical device comprising providing a plurality of planar active layers on a donor substrate, forming a plurality of microdevices on at least one of a top layer of the plurality of the layers, performing a bonding process to bond together the donor substrate to a temporary substrate through a bonding layer, removing the donor substrate, providing a passivation layer on bottom layer of the planar active layers to passivate exposed defects; and providing an electrode over the passivation layer through the openings in the passivation layer.

In summary, the present disclosure provides highly efficient nano-pillars hybrid microdevices that minimize defects in epitaxial layers and sidewalls and improve light emitting efficiency.

While the present disclosure is susceptible to various modifications and alternative forms, specific embodiments or implementations have been shown by way of example in the drawings and are described in detail herein. It should be understood, however, that the disclosure is not intended to be limited to the particular forms disclosed. Rather, the disclosure is to cover all modifications, equivalents, and alternatives falling within the spirit and scope of an invention as defined by the appended claims.

We claim:

1. A vertical device comprising:
a plurality of planar active layers formed on a substrate, at least one layer of the plurality of planar active layers including one or more defects;
a plurality of nano-pillars on a top layer of the plurality of planar active layers that are spaced apart to define a repeating arrangement of nano-pillars, nano-pillars in the repeating arrangement of nano-pillars defined by a predetermined radius and separated by a predetermined distance;
a first passivation layer comprising a dielectric layer formed on the top layer of the plurality of planar active layers covering a space between the plurality of nano-pillars and at least a part of sidewalls of the plurality of nano-pillars, wherein the first passivation layer covers one or more gaps in the top layer of the plurality of planar active layers corresponding to the one or more defects; and
a gate electrode comprising a conductive layer formed on a part of the first passivation layer covering at least in part the space between the plurality of nano-pillars and the part of the sidewalls of the plurality of nano-pillars covered by the first passivation layer,
wherein the gate electrode is configured to bias the plurality of nano-pillars to control a charge accumulated on a surface of the plurality of nano-pillars or a current passing through the plurality of nano-pillars to the plurality of planar active layers such that the gate electrode, the first passivation layer, and the plurality of nano-pillars act as a vertical transistor in series with the plurality of planar active layers of the vertical device.

2. The vertical device of claim 1, further comprising:
a second passivation layer formed over the gate electrode; and
a device electrode formed over the second passivation layer to create a functional area for the vertical device, wherein the device electrode comprises one of: a filler layer or a reflector.

3. The vertical device of claim 2, further comprising:
an ohmic contact layer formed on a top surface of at least one nano-pillar of the plurality of nano-pillars to create one or more nano-contacts.

4. The vertical device of claim 3, wherein the device electrode comprises a separate electrode or a part of the one or more nano-contacts.

5. The vertical device of claim 1, wherein the plurality of nano-pillars is formed by etching down at least one planar layer formed on top of the plurality of planar active layers formed on the substrate.

6. The vertical device of claim 1, wherein the dielectric layer and the conductive layer are configured to spread to other areas of the vertical device.

7. The vertical device of claim 1, further comprising:
a filler layer formed on a top surface of the first passivation layer or formed on the top layer of the plurality of planar active layers instead of the first passivation layer, the filler layer including one of: a polymer, a solgel, and a dielectric.

8. The vertical device of claim 7, wherein the filler layer further includes a color conversion layer.

9. A vertical device comprising:
a substrate;
a plurality of planar active layers formed on the substrate;
a plurality of nano-pillars comprising a doped layer coupled to the plurality of planar active layers, at least a portion of the doped layer being thinned to form the plurality of nano-pillars;
a passivation layer comprising a dielectric layer formed on a top layer of the plurality of planar active layers, the dielectric layer covering a space between the plurality of nano-pillars and a part of sidewalls of the plurality of nano-pillars; and
a gate electrode comprising a conductive layer formed at least on a part of the passivation layer covering the space between the plurality of nano-pillars and the part of the sidewalls of the plurality of nano-pillars,
wherein the gate electrode is configured to bias the plurality of nano-pillars to control a charge accumulated on a surface of the plurality of nano-pillars or a current passing through the plurality of nano-pillars to the plurality of planar active layers such that the gate electrode, the passivation layer, and the plurality of nano-pillars act as a vertical transistor in series with the plurality of planar active layers of the vertical device.

* * * * *